(12) United States Patent
Okada

(10) Patent No.: US 6,920,788 B2
(45) Date of Patent: *Jul. 26, 2005

(54) ACCELERATION SENSOR

(75) Inventor: Kazuhiro Okada, Ageo (JP)

(73) Assignee: Wacoh Corporation, Ageo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/879,317

(22) Filed: Jun. 29, 2004

(65) Prior Publication Data

US 2004/0231422 A1 Nov. 25, 2004

Related U.S. Application Data

(62) Division of application No. 10/419,610, filed on Apr. 21, 2003, now Pat. No. 6,772,632.

(30) Foreign Application Priority Data

May 13, 2002 (JP) ........................ 2002-136596

(51) Int. Cl.⁷ ............................................ G01P 15/08
(52) U.S. Cl. ................................. 73/514.38; 73/514.33
(58) Field of Search ....................... 73/514.32, 514.33, 73/514.36, 514.38

(56) References Cited

U.S. PATENT DOCUMENTS

| | | | |
|---|---|---|---|
| 4,882,933 A | 11/1989 | Petersen et al. | |
| 4,891,985 A | 1/1990 | Glenn | 73/514.38 |
| 4,905,523 A | 3/1990 | Okada | 72/862.04 |
| 4,967,605 A | 11/1990 | Okada | 73/862.04 |
| 4,969,366 A | 11/1990 | Okada | 73/862.08 |
| 5,014,415 A | 5/1991 | Okada | 29/621.1 |
| 5,035,148 A | 7/1991 | Okada | 73/862.04 |
| 5,092,645 A | 3/1992 | Okada | 294/86.4 |
| 5,121,633 A | 6/1992 | Murakami et al. | |
| 5,182,515 A | 1/1993 | Okada | 324/259 |
| 5,263,375 A | 11/1993 | Okada | 73/862.042 |
| 5,295,386 A | 3/1994 | Okada | |
| 5,343,765 A | 9/1994 | Okada | 73/862.043 |
| 5,365,799 A | 11/1994 | Okada | 73/862.041 |
| 5,392,658 A | 2/1995 | Okada | 73/862.043 |
| 5,406,848 A | 4/1995 | Okada | 73/517 R |
| 5,421,213 A | 6/1995 | Okada | 73/862.043 |
| 5,437,196 A | 8/1995 | Okada | 73/862.043 |
| 5,492,020 A | 2/1996 | Okada | 73/862.626 |
| 5,497,668 A | 3/1996 | Okada | 73/862.626 |
| 5,520,051 A * | 5/1996 | Fujii et al. | 73/514.36 |
| 5,531,002 A | 7/1996 | Okada | 29/25.41 |
| 5,531,092 A | 7/1996 | Okada | 73/1 D |
| 5,559,290 A | 9/1996 | Suzuki et al. | |

(Continued)

FOREIGN PATENT DOCUMENTS

| | | |
|---|---|---|
| DE | 4016472 | 11/1991 |
| EP | 0877256 | 11/1998 |
| GB | 2245366 | 1/1992 |
| JP | 09045937 | 2/1997 |

OTHER PUBLICATIONS

Patent Abstracts of Japan of JP 09045937 dated Feb. 14, 1997.

*Primary Examiner*—John E. Chapman
(74) *Attorney, Agent, or Firm*—Ladas & Parry LLP

(57) ABSTRACT

An acceleration sensor in a connecting portion connects a displacing section to a fixed section and a weight is connected to the displacing section from below. A pedestal is disposed adjacent to the weight and is connected to the fixed section by a pedestal joint layer so a displacement of the displacing section can be detected. The weight has a peripheral portion of its upper surface opposite a control surface on a lower surface of the fixed section to come into contact therewith upon a given magnitude of acceleration of the weight. A weight joint layer made of the same material as that of the pedestal joint layer joins the weight and the displacing section.

8 Claims, 24 Drawing Sheets

U.S. PATENT DOCUMENTS

| | | | |
|---|---|---|---|
| 5,571,972 A | 11/1996 | Okada | 73/862.043 |
| 5,639,973 A | 6/1997 | Okada | 73/862.043 |
| 5,646,346 A | 7/1997 | Okada | 73/504.04 |
| 5,668,318 A | 9/1997 | Okada | 73/504.11 |
| 5,682,000 A | 10/1997 | Okada | 73/862.043 |
| 5,744,718 A | 4/1998 | Okada | 73/514.33 |
| 5,780,749 A | 7/1998 | Okada | 73/862.043 |
| 5,811,693 A | 9/1998 | Okada | 73/862.043 |
| 5,831,163 A | 11/1998 | Okada | 73/504.12 |
| 5,850,040 A | 12/1998 | Okada | 73/504.04 |
| 5,856,620 A | 1/1999 | Okada | 73/514.32 |
| 5,962,787 A | 10/1999 | Okada et al. | 73/514.32 |
| 5,987,985 A | 11/1999 | Okada | 73/504.04 |
| 6,003,371 A | 12/1999 | Okada | 73/504.02 |
| 6,053,057 A | 4/2000 | Okada | 73/862.043 |
| 6,076,401 A | 6/2000 | Okada | 73/504.12 |
| 6,098,461 A | 8/2000 | Okada | 73/514.34 |
| 6,158,291 A | 12/2000 | Okada | 73/862.043 |
| 6,159,761 A | 12/2000 | Okada | 438/53 |
| 6,185,814 B1 | 2/2001 | Okada | 29/621.1 |
| 6,205,856 B1 | 3/2001 | Okada | 73/504.11 |
| 6,269,697 B1 | 8/2001 | Okada | 73/504.02 |
| 6,282,956 B1 | 9/2001 | Okada | 73/504.12 |
| 6,314,823 B1 | 11/2001 | Okada | 73/862.043 |
| 6,367,326 B1 | 4/2002 | Okada | 73/504.12 |
| 6,378,381 B1 | 4/2002 | Okada et al. | 73/862.043 |
| 6,474,133 B1 | 11/2002 | Okada | 73/1.38 |
| 6,477,903 B2 | 11/2002 | Okada | 73/862.043 |
| 6,512,364 B1 | 1/2003 | Okada | 324/158.1 |
| 6,530,283 B2 | 3/2003 | Okada et al. | 73/780 |
| 6,716,253 B2 | 4/2004 | Okada | 73/52 |

\* cited by examiner

ACCELERATION SENSOR

This application is a divisional of application Ser. No. 10/419,610 filed on Apr. 21, 2003 now U.S. Pat. No. 6,772,632, which designated the U.S., claims the benefit thereof and incorporates the same by reference.

BACKGROUND OF THE INVENTION

The present invention relates to an acceleration sensor and a manufacturing method for the same, and more specifically, a mass production type acceleration sensor to be used for small-sized household electronic devices and a manufacturing method for the same.

Household electronic devices with a microprocessor installed inside, such as cell phones, digital cameras, electronic games, and PDAs have strongly spread, and recently, the demand for acceleration sensors to be installed in these electronic devices or input devices of electronic devices has also increased. In an electronic device having an acceleration sensor installed inside, acceleration components with an impact or a vibration applied to the device main body can be taken in the microprocessor as digital data, so that proper processing while grasping the physical environments around the electronic device becomes possible. For example, in the case of a digital camera, correction for camera shake can be carried out by detecting the acceleration that has acted at the moment when the shutter button is pressed. Furthermore, in an input device of an electronic game, it also becomes possible to input a user's operation instruction in the form of an acceleration. For example, when an acceleration sensor is used for detection of an gravity acceleration, the acceleration sensor can be used as a clinometer, and it becomes possible to recognize the azimuth of the entire electronic device (degree of inclination from the horizontal status), so that predetermined operation and input become possible based on a user's operation for inclining the entire electronic device.

It is desirable that an acceleration sensor to be installed inside such a small-sized household electronic device is small-sized and suitable for mass production. For example, Japanese Patent Publications No. 01-263576 and No. 03-202778 disclose structures of small-sized acceleration sensors suitable for mass production, and Japanese Patent Publication No. 04-249726 discloses a manufacturing method for mass production of such an acceleration sensor by using a silicon substrate. As such a general acceleration sensor, a type has been generally used in which a weight is joined to a flexible substrate, and the substrate is bent in response to an acceleration applied to the weight, and the bend of this substrate is electrically detected. For detecting the bend of the substrate, various detectors such as a piezo resistor element, a capacitor element, or a piezoelectric element have been used.

As mentioned above, as a small sized acceleration sensor suitable for mass production, a sensor using a semiconductor substrate such as a silicon substrate has been proposed. In order to increase the detection sensitivity in such an acceleration sensor, an increase in weight mass or an increase in flexibility of the weight supporting portion is required. However, in all cases where an excessive acceleration is applied, there is a possibility that the weight supporting portion is broken. Particularly, if the sensor casing drops by mistake, a great impact is applied to the weight, and there is a possibility that the weight supporting portion formed of a semiconductor is damaged. Therefore, it is required to provide a physical control structure for controlling displacements of the weight within a predetermined range under normal conditions. Also in the case of the acceleration sensors disclosed in the abovementioned publications, a physical control structure such as a control substrate or a pedestal is provided for controlling vertical and horizontal displacements of the weight. When an excessive acceleration acts, a part of the weight comes into contact with the control substrate or the pedestal, and this suppresses displacements of the weight within a predetermined range of freedom. Therefore, the weight supporting portion can be prevented from being applied with an excessive stress and being broken.

However, it is required that such a control structure has a predetermined shape and is disposed at a predetermined position in accordance with the shape and disposition of the weight. Therefore, in order to manufacture an acceleration sensor with a control structure, an etching step or machining step is additionally required, and this makes the manufacturing process complicated. Particularly, in order to secure uniform performance among lots to be manufactured as mass-produced items, it is required that the distance between the weight and the control structure is accurately set. Therefore, in the conventional acceleration sensors disclosed in the abovementioned publications, a great technical burden is imposed on the step for forming the control structure, and this also poses a problem in terms of cost reduction.

SUMMARY OF THE INVENTION

An object of the invention is, therefore, to provide an acceleration sensor in which an accurate control structure for controlling displacements of the weight can be easily constructed.

(1) The first feature of the present invention resides in an acceleration sensor comprising:

a substrate layer having a displacing section provided at a central portion, a fixed section provided around the displacing section, and a connecting portion for connecting the displacing section to the fixed section so that the displacing section can displace;

a weight disposed under the substrate layer, the weight including an upper surface peripheral portion that opposes a control surface formed on a lower surface of an inner part of the fixed section;

a pedestal which is disposed so as to surround the weight and supports and fixes the fixed section from below;

a weight joint layer which is interposed in a region other than the upper surface peripheral portion in a space between the weight and the substrate layer and is made of a material different from that of the weight and the substrate layer, and connects the weight to a lower surface of the displacing section; and a displacement detector for detecting a displacement of the displacing section; wherein when an acceleration is applied to the weight, the displacing section displaces with respect to the fixed section due to bending of the connecting portion, and a thickness of the weight joint layer is set so that the upper surface peripheral portion comes into contact with the control surface to control displacement when a degree of a predetermined directional component of an applied acceleration exceeds a predetermined tolerance.

(2) The second feature of the present invention resides in an acceleration sensor according to the first feature, wherein:

a pedestal joint layer made of the same material as that of the weight joint layer is provided between the pedestal and the fixed section, and the pedestal and the fixed section are joined together by the pedestal joint layer.

(3) The third feature of the present invention resides in an acceleration sensor according to the second feature, wherein:

a material for forming the substrate layer, the pedestal, and the weight and a material for forming the weight joint layer and the pedestal joint layer are different in etching property from each other.

(4) The fourth feature of the present invention resides in an acceleration sensor according to the first to the third features, wherein a slit is formed in the substrate layer so that portions of the substrate layer serve as a displacing section, a fixed section, and a connecting portion.

(5) The fifth feature of the present invention resides in an acceleration sensor according to the fourth feature, wherein:

a plurality of slits that have an annular shape partially including an aperture are formed so that apertures face a center of the substrate layer; and a structure with a fan shape including blade portions surrounded by the respective annular slits is regarded as a displacing section, a portion formed between a pair of slits adjacent to each other is regarded as a connecting portion, and an outer peripheral portion of the substrate layer positioned more outwardly than an outer envelope of the plurality of slits is regarded as a fixed section.

(6) The sixth feature of the present invention resides in an acceleration sensor according to the fifth feature, wherein:

four slits which are formed along contours of approximate squares and have the same annular shape including an aperture at a portion corresponding to one apex of a square are symmetrically formed on the substrate layer that is approximate square.

(7) The seventh feature of the present invention resides in an acceleration sensor according to the fifth or sixth feature, wherein:

a contour of an upper surface of the weight has a shape which is obtained by outwardly expanding a contour of the displacing section so that displacement of the upper surface peripheral portion of the weight is controlled by the control surface in a region outside and close to an outer envelope of the plurality of slits on a lower surface of the substrate layer.

(8) The eighth feature of the present invention resides in an acceleration sensor according to the seventh feature, wherein:

the weight joint layer includes a central portion joint layer for joining the displacing section and the weight at a central portion of the fan shape and blade portion joint layers for joining the displacing section and the weight at respective blade portions of the fan shape.

(9) The ninth feature of the present invention resides in an acceleration sensor according to the first to the eighth features, wherein:

a distance between a side surface of the weight and an inner surface of the pedestal is set so that displacement of the weight is controlled by contact of the side surface of the weight with the inner surface of the pedestal when a degree of a predetermined directional component of an applied acceleration exceeds a predetermined tolerance.

(10) The tenth feature of the present invention resides in an acceleration sensor according to the first to the ninth features, wherein:

a thickness of the weight is set so that a bottom surface of the weight is located above a bottom surface of the pedestal with a predetermined distance, and when the pedestal is fixed on a control substrate, the predetermined distance is secured between the bottom surface of the weight and the upper surface of the control substrate; and the predetermined distance is set so that displacement of the weight is controlled by contact of the bottom surface of the weight with the upper surface of the control substrate when a degree of a predetermined directional component of an applied acceleration exceeds a predetermined tolerance.

(11) The eleventh feature of the present invention resides in an acceleration sensor according to the first to the tenth features, wherein:

the displacement detector includes piezo resistor elements disposed on the connecting portion and a detecting circuit for detecting electric resistance changes of the piezo resistor elements.

(12) The twelfth feature of the present invention resides in an acceleration sensor according to the eleventh feature, wherein:

a left connecting portion is provided at a left of the displacing section and a right connecting portion is provided at a right of the displacing section, two piezo resistor elements are disposed on the left connecting portion and two piezo resistor elements are disposed on the right connecting portion so that a total of four piezo resistor elements are aligned roughly in line, and the detecting circuit includes bridges using the four piezo resistor elements.

(13) The thirteenth feature of the present invention resides in an acceleration sensor according to the first to the tenth features, wherein:

the displacement detector includes an auxiliary substrate disposed at a predetermined distance above the substrate layer, a displacing electrode formed on an upper surface of the displacing section, a fixed electrode formed on a lower surface of the auxiliary substrate, and a detecting circuit for detecting changes in capacitance of a capacitor element formed by the displacing electrode and the fixed electrode.

(14) The fourteenth feature of the present invention resides in an acceleration sensor according to the thirteenth feature, wherein at least an upper surface region opposing the fixed electrode, of the displacing section has conductivity, and the displacing section itself is used as a displacing electrode.

(15) The fifteenth feature of the present invention resides in a manufacturing method for the acceleration sensor according to the second feature, comprising:

a preparation step for preparing a material substrate including laminated three layers of a first layer, a second layer, and a third layer in order from the upper side;

a substrate layer forming step for forming a substrate layer including a displacing section, a fixed section, and a connecting portion by forming a slit in the first layer by etching predetermined regions of the first layer in a thickness direction until an upper surface of the second layer is exposed according to an etching method that has erodibility for the first layer and does not have erodibility for the second layer;

a weight/pedestal separating step for separating the third layer into a weight and a pedestal by etching predetermined regions of the third layer in a thickness direction until a lower surface of the second layer is exposed according to an etching method that has erodibility for the third layer and does not have erodibility for the second layer; and a joint layer forming step for forming a weight joint layer and a pedestal joint layer by remaining portions after etching the second layer in a thickness direction and a layer surface direction from exposed portions of the second layer according to an etching method that has erodibility for the second layer and does not have erodibility for the first and third layers.

(16) The sixteenth feature of the present invention resides in a manufacturing method for the acceleration sensor according to the fifteenth feature, wherein:

in the substrate layer forming step, a plurality of slits that have an annular shape partially including an aperture are formed so that the aperture faces a center of the first layer; and a displacing section is formed by a structure having a fan shape that includes blade portions surrounded by the respective annular slits, a portion between a pair of slits adjacent to each other is formed as a connecting portion, and a fixed section is formed of an outer peripheral portion of the first layer positioned more outwardly than an outer envelope of the plurality of slits.

(17) The seventeenth feature of the present invention resides in a manufacturing method for the acceleration sensor according to the sixteenth feature, wherein:

in the weight/pedestal separating step, etching for separating a weight and a pedestal is carried out at a position more outward than the outer envelope of the plurality of slits, so that a weight having a contour expanding more outwardly than a contour of the displacing section is formed, and displacement of the upper surface peripheral portion of the weight can be controlled by a control surface formed in a region outside and close to the outer envelope on a lower surface of the first layer.

(18) The eighteenth feature of the present invention resides in a manufacturing method for the acceleration sensor according to the fifteenth to the seventeenth features, further comprising:

a thickness adjusting step for making a thickness of the weight smaller than a thickness of the pedestal by removing a lower layer portion of a region where the weight is formed of the third layer by etching; and a control substrate joining step for joining a control substrate to a bottom surface of the pedestal.

(19) The nineteenth feature of the present invention resides in a manufacturing method for the acceleration sensor according to the fifteenth to the eighteenth features, wherein:

the first layer and the third layer are made of the same material.

(20) The twentieth feature of the present invention resides in a manufacturing method for the acceleration sensor according to the nineteenth feature, wherein:

the first layer and the third layer are made of silicon, and the second layer is made of silicon oxide.

(21) The twenty-first feature of the present invention resides in a manufacturing method for the acceleration sensor according to the fifteenth to the twentieth features, wherein:

an induced coupling plasma etching method is used for etching in the thickness direction in the substrate layer forming step and the weight/pedestal separating step.

DETAILED DESCRIPTION OF THE PREFERRED EMBODIMENTS

Hereinafter, the invention is described based on the illustrated embodiments.

<<Section 1. Basic Structure of Transducer Structure>>

First, the basic structure of a transducer structure for acceleration detection to be used in an acceleration sensor relating to the invention. Components forming the center of this transducer are a substrate layer and a weight. The weight is joined to a lower surface central portion of the substrate layer. When an acceleration is applied to the weight, due to this applied acceleration, the substrate layer partially displaces. In other words, this transducer structure functions to converts the acceleration into a displacement of the substrate layer. As described in Section 3, an acceleration sensor relating to the invention is obtained by adding a displacement detector which electrically detects a displacement to this transducer.

Figure 1:
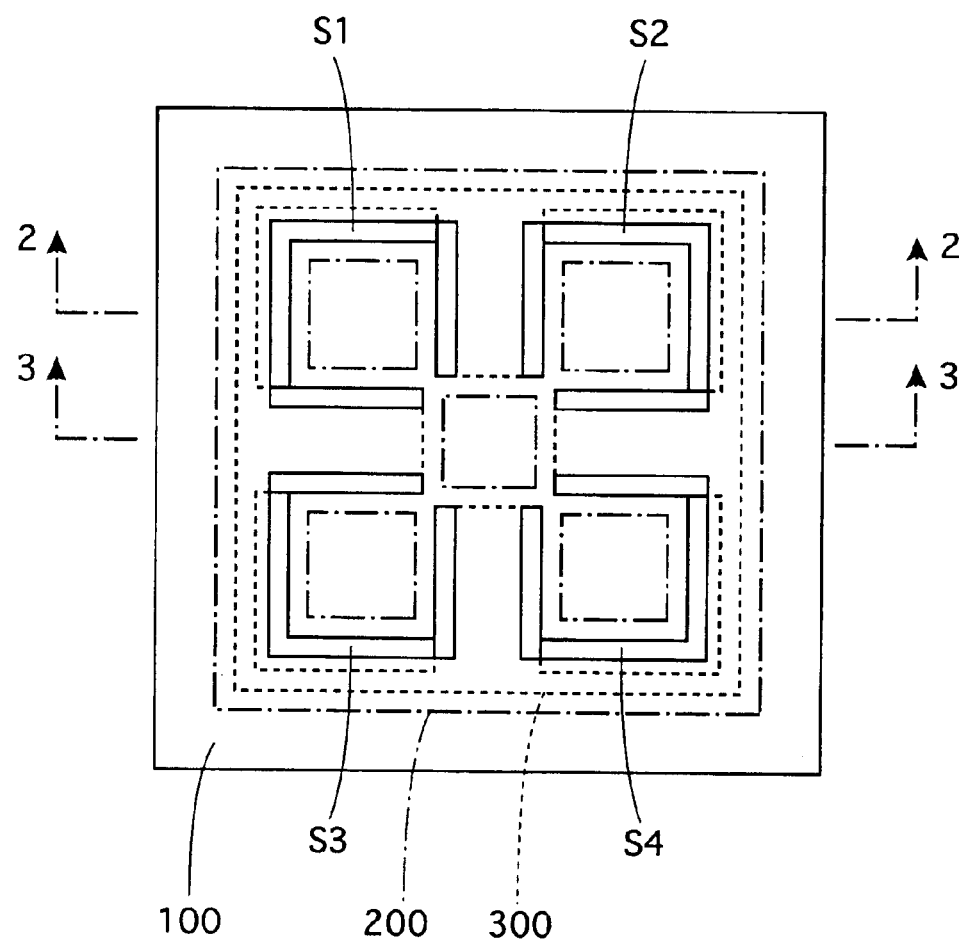
FIG. 1 is a top view of a transducer structure relating to an embodiment of the invention.

FIG. 1 is a top view of a transducer structure relating to an embodiment of the invention. This transducer structure basically has a trilaminar structure composed of an upper layer 100 made from silicon, a middle layer 200 made from silicon oxide, and a lower layer 300 made from silicon. A material having such a trilaminar structure composed of silicon/silicon oxide/silicon is commercially available as an SOI (Silicon On Insulator) substrate, and the transducer structure shown herein can be manufactured by a manufacturing process using this SOI substrate.

Figure 2:
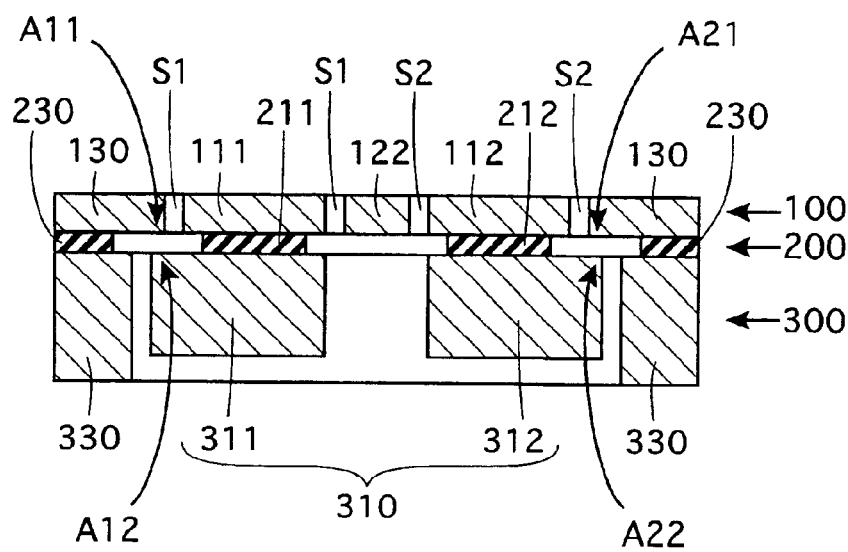
FIG. 2 is a sectional side view along the cutting line 2—2 of the transducer structure of FIG. 1.
Figure 3:
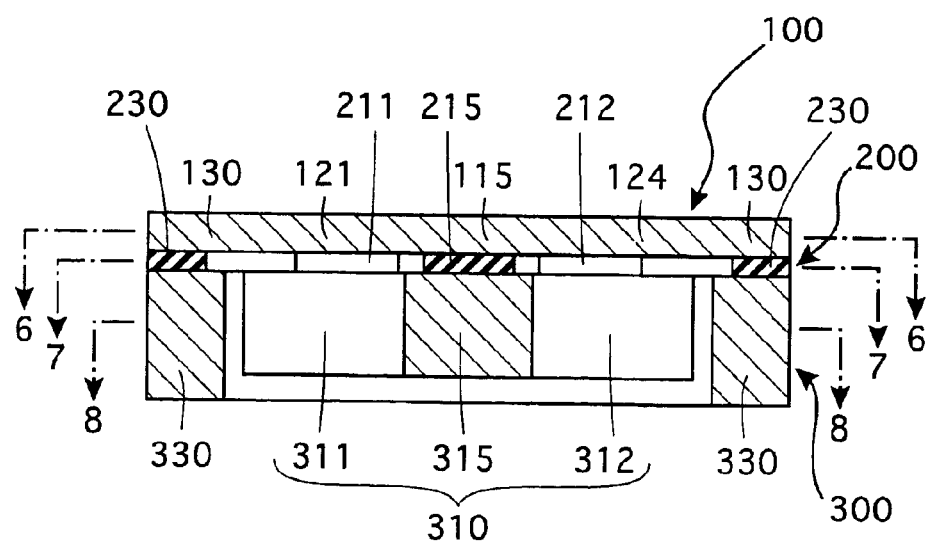
FIG. 3 is a sectional side view along the cutting line 3—3 of the transducer structure of FIG. 1.
Figure 4:
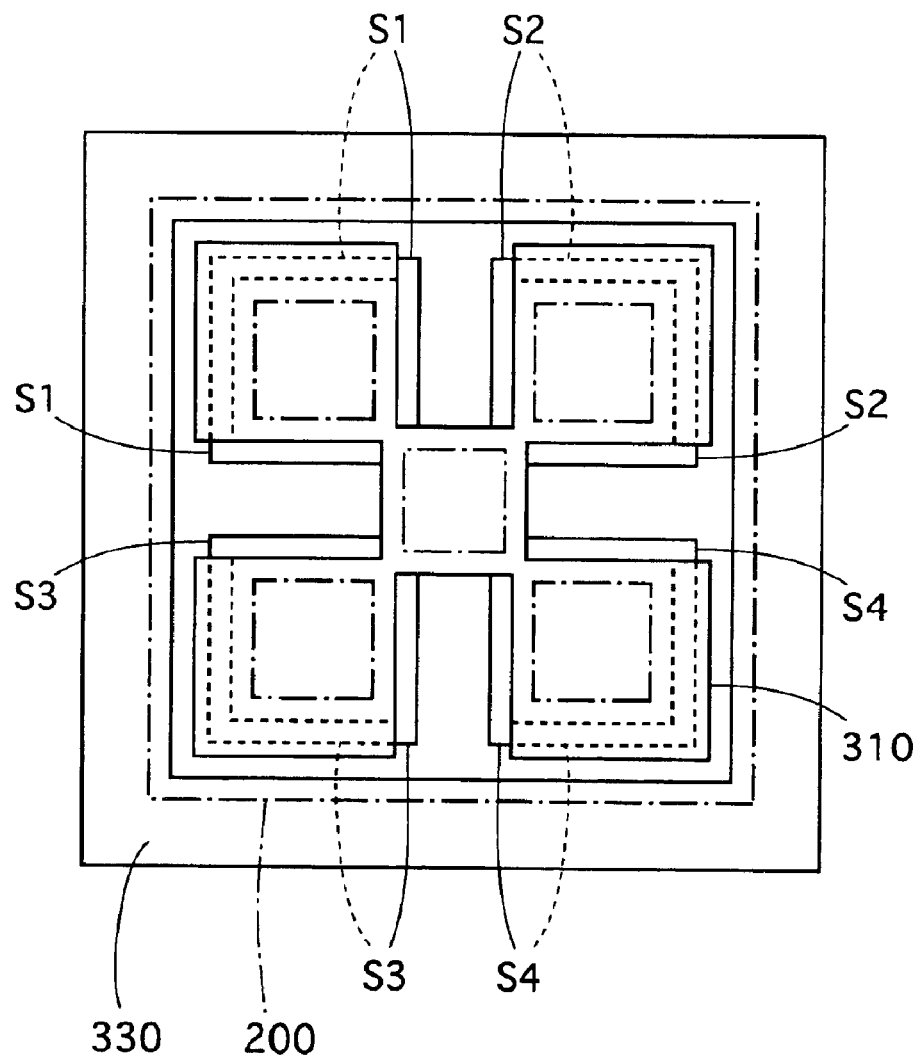
FIG. 4 is a bottom view of the transducer structure of FIG. 1.

In the embodiment shown herein, the upper layer 100, the middle layer 200, and the lower layer 300 are basically square plate members. In the upper layer 100, slits S1 through S4 penetrating in the thickness direction are formed, and in FIG. 1, a part of the lower layer 300 is viewed through the slits S1 through S4. In FIG. 1, the structure of the middle layer 200 concealed under the upper layer 100 is shown by an alternate long and short dashed line, and the structure of the lower layer 300 is shown by a dashed line, so that this figure is complicated. On the other hand, FIG. 2 is a sectional side view along the cutting line 2—2 of the transducer structure of FIG. 1, and FIG. 3 is a sectional side view along the cutting line 3—3 of the transducer structure of FIG. 1. In these sectional side views, it is clearly shown that this transducer structure has a trilaminar structure composed of the upper layer 100, the middle layer 200, and the lower layer 300. Herein, for the sake of simple description, components of the upper layer 100 are indicated by reference numerals between 100 and 199, components of the middle layer 200 are indicated by reference numerals between 200 and 299, and components of the lower layer 300 are indicated by reference numerals between 300 and 399. FIG. 4 is a bottom view of this transducer structure, and in this bottom view, the structure of the middle layer 200 concealed by the lower layer 300 is shown by an alternate long and short dashed line, and the structure of the upper layer 100 is shown by a dashed line.

The top view of FIG. 1 and the bottom view of FIG. 4 are convenient for confirmation of the relative positional relationship of the layers, however, they are complicated since all three layers are overlapped in a single drawing. Therefore, these figures are not necessarily appropriate to describe the fine structure of each layer. Therefore, by using plan views that independently show the respective layers, the structure of each layer is described in order while referring to the sectional side views of FIG. 2 and FIG. 3.

Figure 5:
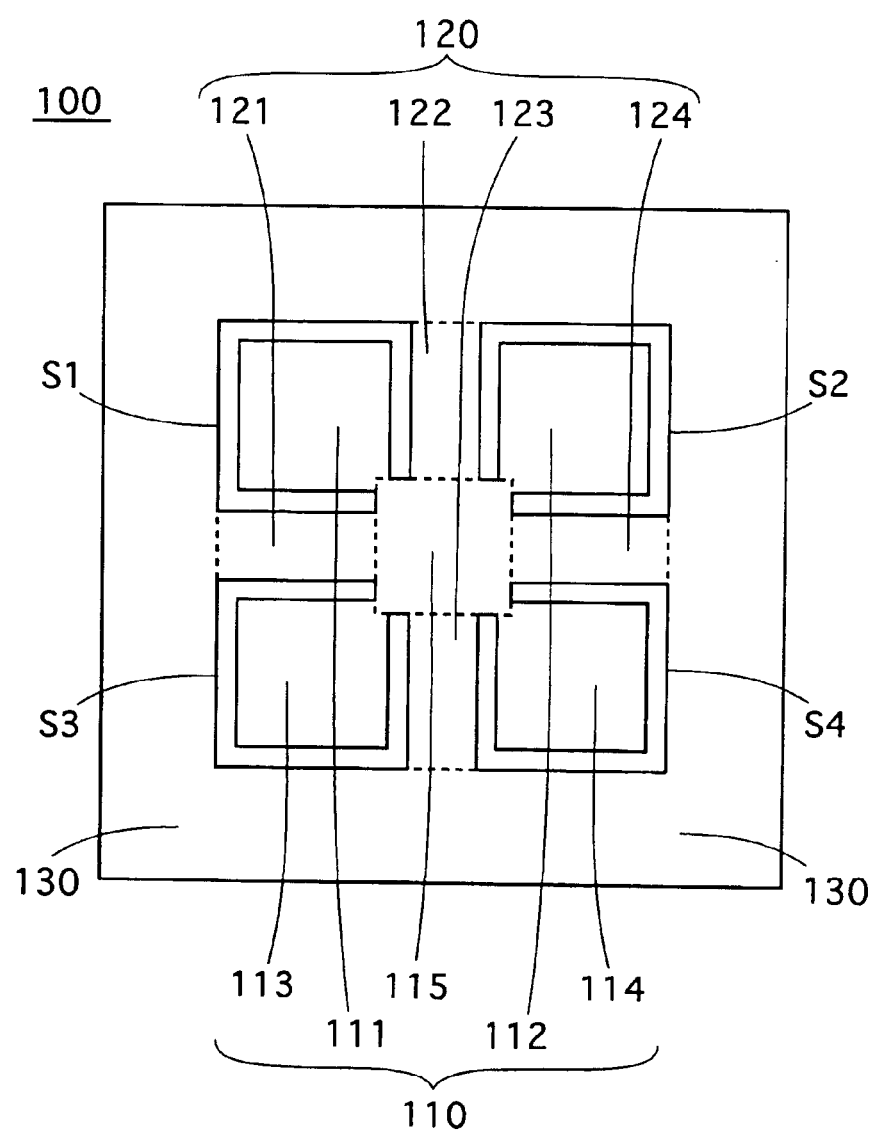
FIG. 5 is a top view of only an upper layer 100 shown in the sectional side view of FIG. 3.

First, the structure of the upper layer 100 is described with reference to FIG. 5. This FIG. 5 is a top view showing only the upper layer 100. As seen in the figure, the upper layer 100 is formed of a square plate member and has slits S1 through S4 penetrating in the thickness direction. In this embodiment, the upper layer 100 is formed of a silicon substrate layer, and the slits S1 through S4 are formed by etching this silicon substrate layer as described later. By forming these slits S1 through S4, the upper layer 100 can be divided into sections of a plurality of regions as seen in the figure. The dashed lines shown in FIG. 5 indicate boundaries of these regions for convenience. As a matter of course, these dashed lines do not indicate strict boundary positions of the respective regions, but are drawn in consideration of convenience in description.

Figure 6:
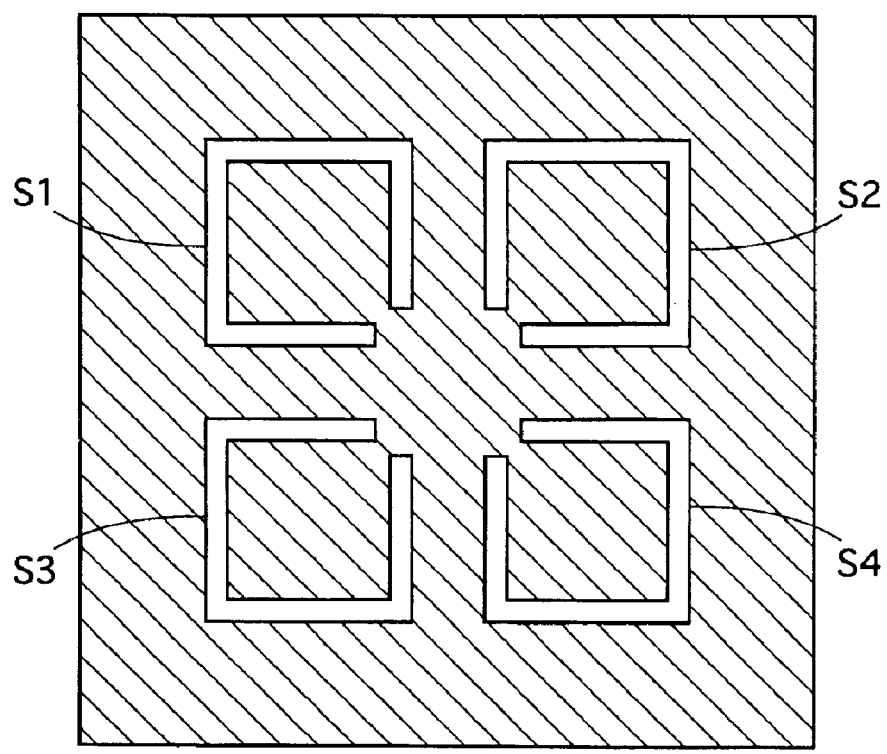
FIG. 6 is a horizontal sectional view of only the upper layer 100 obtained by cutting the upper layer 100 along the cutting line 6—6 in the sectional side view of FIG. 3.

Herein, before describing the respective sections formed on the upper layer 100, the unique shapes of the four slits S1 through S4 are described. FIG. 6 is a horizontal sectional view along the cutting line 6—6 of the upper layer 100 of the sectional side view of FIG. 3, and clearly shows the shapes and dispositions of the slits S1 through S4 penetrating in the thickness direction. Namely, the slits S1 through S4 have angled annular narrow band shapes that are formed along outlines of almost squares. These shapes are not completely annular, and at a portion corresponding to one corner of the square, an aperture is formed, and respective sections are joined to each other via this aperture. In other words, the upper layer is structured as one substrate layer as a whole, and hereinafter, this upper layer 100 is referred to as a substrate layer 100 in some cases.

The shapes of the four slits S1 through S4 are as completely same, however, the apertures of the respective slits are formed so as to face the center of the substrate layer 100 in a symmetric manner (symmetric horizontally and vertically in the plan view of FIG. 6). By forming these four slits S1 through S4, a fan-shaped structure is formed at the center of the substrate layer 100.

As shown in the top view of FIG. 5, the sections surrounded by the respective annular slits S1, S2, S3, and S4 are referred to as blade portions 111, 112, 113, and 114, respectively, and the square section at the center of the substrate layer 100 is referred to as a central portion 115. The fan-shaped structure is formed by these blade portions 111 through 114 and the central portion 115. Herein, this fan-shaped structure is referred to as a displacing section 110. Furthermore, as shown in FIG. 5, the rectangular sections each of which is formed between a pair of slits adjacent to each other are referred to as connecting portions 121, 122, 123, and 124 herein (collectively referred to as a connecting section 120), and the outer peripheral portion of the substrate layer 100 positioned at the outer side of the outer envelopes of the plurality of slits S1 through S4 is referred to as a fixed section 130.

As mentioned above, in this embodiment, the substrate layer 100 is formed of a silicon substrate layer, and the connecting portions 121 through 124 having beam-like structures have physical properties that cause bending in response to action of an external force. In other words, the width and thickness (thickness of the substrate layer 100) of the connecting portions 121 through 124 are set so as to cause bending in response to action of an external force. Therefore, as described later, when an external force is applied to the displacing section 110, this external force is transmitted to the respective connecting portions 121 through 124 and causes them to bend. Consequently, the displacing section 110 is caused to displace with respect to the fixed section 130. As a result, the substrate layer 100 shown in FIG. 5 is divided into three sections including the displacing section 110 at the center, the fixed section 130 provided at the periphery of this displacing section 110, and the connecting section 120 for connecting the displacing section 110 to the fixed section 130 in a manner enabling the displacing section to displace.

In this embodiment, four square slits S1 through S4 are formed, however, it is not always necessary that these slits are square and these slits are four. Generally, a plurality of slits that have annular shapes partially including apertures are formed so that the apertures face the center of the substrate layer 100. Thereby, a fan-shaped structure using the portions surrounded by the annular slits as blade portions can be regarded as a displacing section, the portions each of which are formed between a pair of slits adjacent to each other can be regarded as connecting portions, and the outer peripheral portion of the substrate layer 100 positioned at the outer side of the outer envelopes of the plurality of slits can be regarded as a fixed section. However, from a practical standpoint, forming four square slits S1 through S4 as in this embodiment is efficient since the displacing section 100 can be secured as large as possible, and the four band-shaped connecting portions 121 through 124 can support this displacing section 110 from the four directions.

Figure 7:
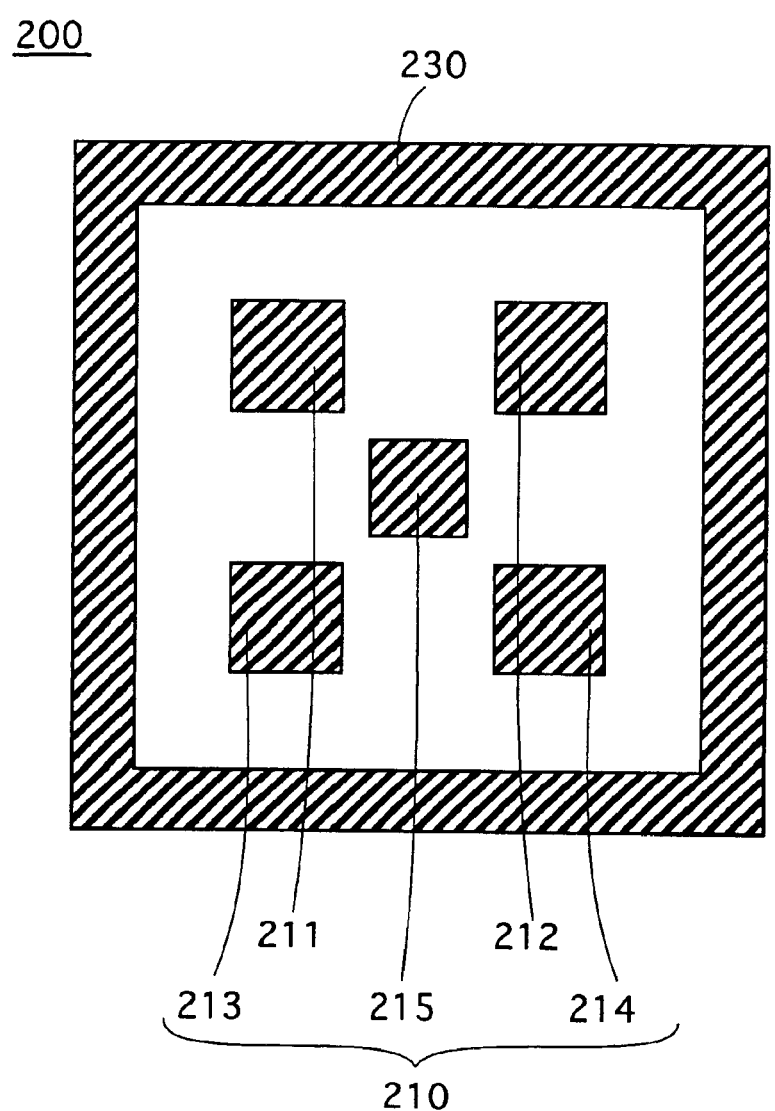
FIG. 7 is a horizontal sectional view of only a middle layer 200 obtained by cutting the middle layer 200 along the cutting line 7—7 in the sectional side view of FIG. 3.

Next, the structure of the middle layer 200 is described with reference to FIG. 7. This FIG. 7 is a horizontal sectional view showing only the middle layer 200, and is equivalent to a horizontal sectional view along the cutting line 7—7 of the middle layer 200 of the sectional side view of FIG. 3. The middle layer 200 is formed by, as described later, etching a silicon oxide layer the layer surface of which is square. As shown in the figure, the middle layer 200 is composed of five weight joint layers 210 and a pedestal joint layer 230 that is disposed so as to surround these and has an angled annular shape. These joint layers have the same thickness. The weight joint layers 210 include four blade portion joint layers 211, 212, 213, and 214 and one central portion joint layer 215.

Figure 8:
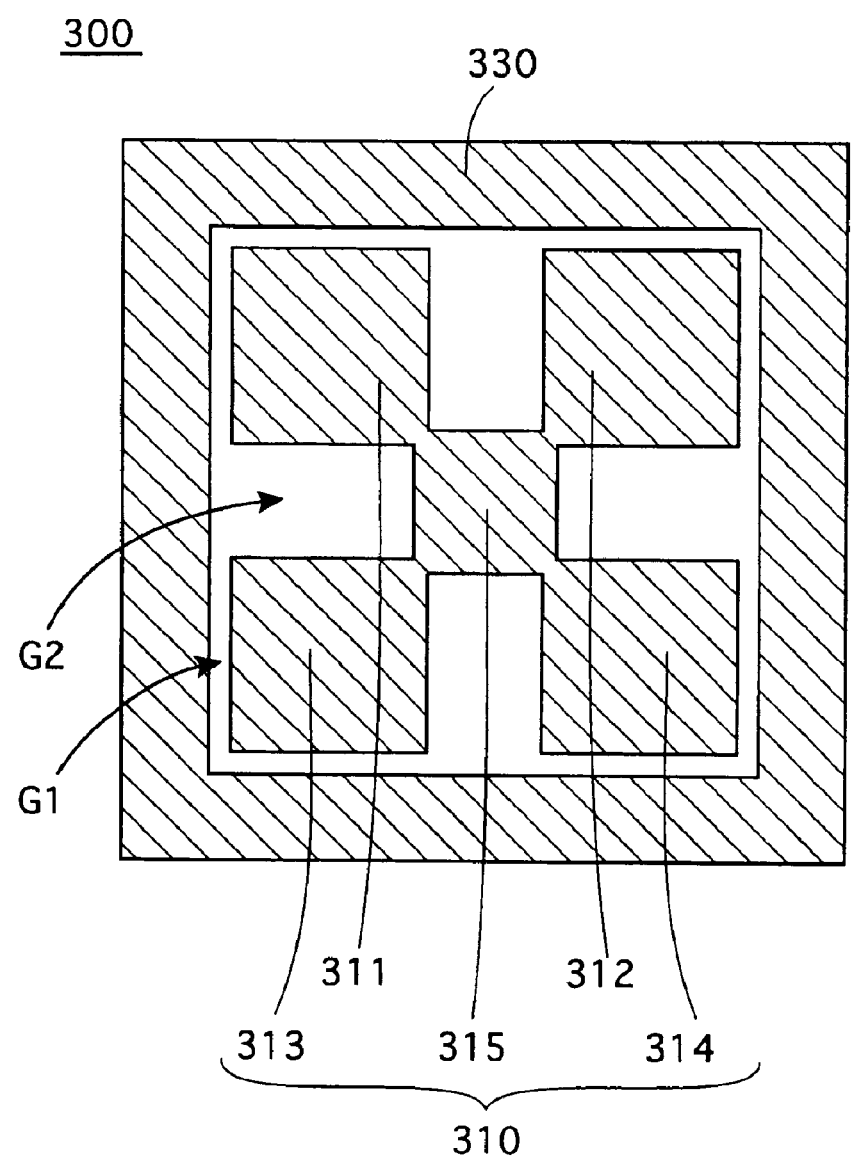
FIG. 8 is a horizontal sectional view of only a lower layer 300 obtained by cutting the lower layer 300 along the cutting line 8—8 in the sectional side view of FIG. 3.

Last, the structure of the lower layer 300 is described with reference to FIG. 8. This FIG. 8 is a horizontal sectional view showing only the lower layer 300, and equivalent to a horizontal sectional view along the cutting line 8—8 of the lower layer 300 of the sectional side view of FIG. 3. In the case of the embodiment shown herein, the lower layer 300 is formed by, as described later, etching a silicon layer the layer surface of which is square. Grooves G1 and G2 shown in the figure are portions from which silicon has been removed by this etching. As seen in the figure, the lower layer 300 is composed of a fan-shaped weight 310 and a pedestal 330 that is disposed so as to surround the weight 310 and has an angled annular shape. The weight 310 consists of weight blade portions 311, 312, 313, and 314, and a weight central portion 315, and these correspond to the blade portions 111, 112, 113, and 114 and the central portion 115 that are included in the displacing section 110 shown in FIG. 5, and also correspond to the blade portion joint layers 211, 212, 213, and 214 and the central portion joint layer 215 of FIG. 7.

The structures of the upper layer 100, the middle layer 200, and the lower layer 300 are individually described above, and a transducer structure relating to an embodiment described hereinafter is obtained by joining these three layers as shown in the top view of FIG. 1, the sectional side views of FIG. 2 and FIG. 3, and the bottom view of FIG. 4. Namely, to the lower surfaces of the blade portions 111 through 114 and the central portion 115 that are components of the upper layer 100 (substrate layer), the blade portion joint layers 211 through 214 and the central portion joint layer 215 that are components of the middle layer 200 are joined, and furthermore, to the lower surfaces of these, the weight blade portions 311 through 314 and the weight central portion 315 that are components of the lower layer 300 are joined. In other words, the weight joint layer 210 is composed of the respective blade portion joint layers 211 through 214 that join the displacing section 110 and the weight 310 at the positions of the blade portions of the fan shape, and the central joint layer 215 that joins the displacing section 110 and the weight 310 at the central position of the fan shape. To the lower surface of the fixed section 130 composing the periphery of the upper layer 100 (substrate layer), the pedestal joint layer 230 composing the periphery of the middle layer 200 is joined, and to the lower surface of the pedestal joint layer 230, the pedestal 330 composing the periphery of the lower layer 300 is further joined.

Figure 9:
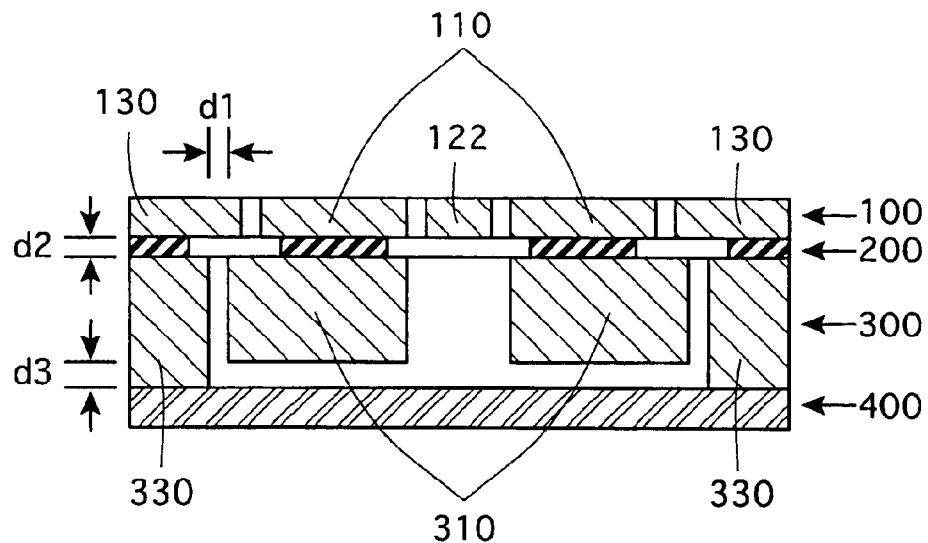
FIG. 9 is a sectional side view showing a condition where a control substrate 400 is attached to the lower surface of the transducer structure shown in the sectional side view of FIG. 2.
Figure 10:
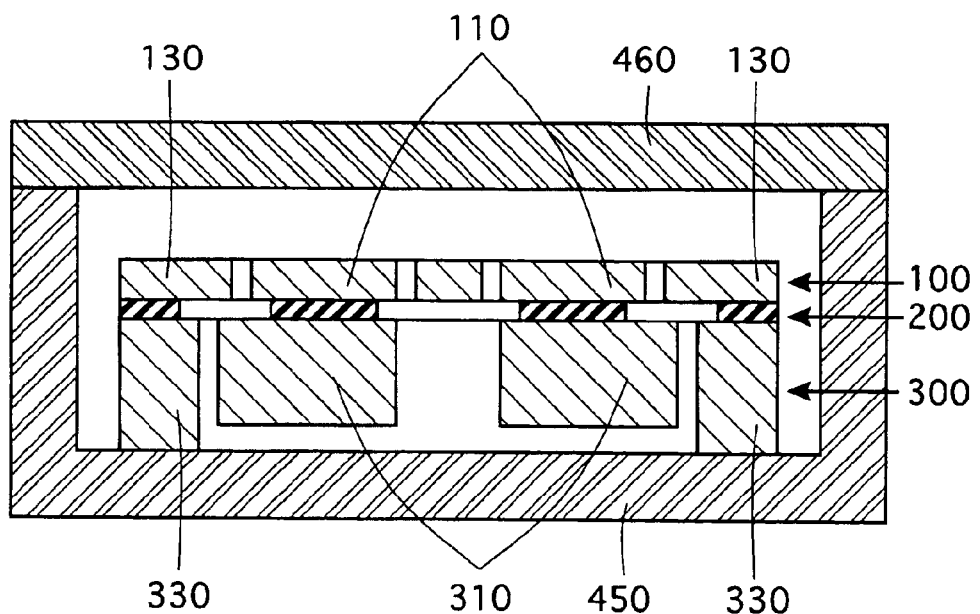
FIG. 10 is a sectional side view showing a condition where the transducer structure shown in the sectional side view of FIG. 2 is housed in a device casing 450.

From a practical standpoint, as shown in the sectional side view of FIG. 9 (sectional view along the cutting line 2—2 of the top view of FIG. 1: the following side sectional views are cut in the same manner as this), a control substrate 400 (for example, glass substrate) is further joined to the bottom surface of the pedestal 330. This control substrate 400 is for controlling downward displacements of the weight 310 as described later. The sectional side view of FIG. 10 shows an embodiment in which the bottom surface of the pedestal 330 is fixed to the bottom of a device casing 450, and a cover plate 460 is attached onto the top of the device casing 450 to closely seal it. In this case, the bottom of the device casing 450 serves as the control substrate.

<<Section 2. Operation as Acceleration Sensor>>

Next, operation of an acceleration sensor using the transducer structure described in Section 1 above is described. As shown in the sectional side view of FIG. 9 or FIG. 10, in this transducer structure, the weight 310 is attached to the lower surface of the substrate layer 100 (lower surface of the displacing section 110), and the fixed section 130 composing the periphery of the substrate layer 100 is supported and fixed by the pedestal 330. The displacing section 110 is supported in a manner enabling it to displace with respect to the fixed section 130 via the connecting section 120, so that the weight 310 is suspended in midair in the space surrounded by the pedestal 330. Therefore, when the pedestal 330 (control substrate) is fixed to an acceleration detecting target, the acceleration acting on this detecting target also acts on the weight 310 as a reaction, and a force for displacing the weight 310 with respect to the pedestal 330 is generated. Such a force bends the connecting section 120, and the displacing section 110 relatively displaces with respect to the fixed section 130.

Thus, the transducer structure described herein has a function for converting an applied acceleration into a displacement of the displacing section 110. The acceleration sensor relating to the invention detects the applied acceleration by detecting the displacement of the displacing section 110 thus caused by a displacement detector, and is realized by further adding the displacement detector to the transducer structure of FIG. 9 or FIG. 10. A detailed example of the displacement detector is described in Section 3. The operation of an acceleration sensor using this transducer structure in a case where an excessive acceleration is applied is described herein.

As aforementioned, the substrate layer 100 of the transducer structure relating to the embodiment shown herein is formed of a silicon substrate. In addition, as shown in FIG. 5, slits S1 through S4 are formed in the substrate layer 100, and the connecting section 120 that is bent by a stress caused by an acceleration has an extremely delicate structure, and may be broken when being applied with an excessive acceleration. Therefore, a control structure which controls displacements of the weight 310 in a case where an excessive acceleration is applied is provided in the abovementioned transducer structure.

For example, a case where an excessive acceleration downward is applied to the weight 310 of the transducer structure of FIG. 9 is considered. In this case, a force acts to displace the weight 310 downward in the figure, however, the bottom surface of the weight 310 comes into contact with the upper surface of the control substrate 400, and this prevents the weight 310 from displacing over this upper surface. Namely, in the transducer structure shown in FIG. 9, the bottom surface of the weight 310 is positioned at a predetermined distance d3 above the bottom surface of the pedestal 330 so that the predetermined distance d3 is secured between the bottom surface of the weight 310 and the upper surface of the control substrate 400 when the weight 310 is fixed above the control substrate 400. Therefore, the weight 310 can freely displace downward within the range of the distance d3. However, in a case where an acceleration exceeding a predetermined tolerance is applied, as shown in the sectional side view of FIG. 11, the bottom surface of the weight 310 comes into contact with the upper surface of the control substrate 400 and its displacement is controlled.

Thus, since the control substrate 400 controls downward displacements of the weight 310, even when an excessive acceleration is applied, the substrate layer 100 can be prevented from being broken. Therefore, the predetermined distance d3 shown in FIG. 9 is a dimensional value that gives the weight 310 freedom in downward displacements, and this value is set within a safe range in which the substrate layer 100 is prevented from being broken upon consideration as to what degree of a downward displacement of the weight 310 causes the substrate layer 100 to break.

Figure 12:
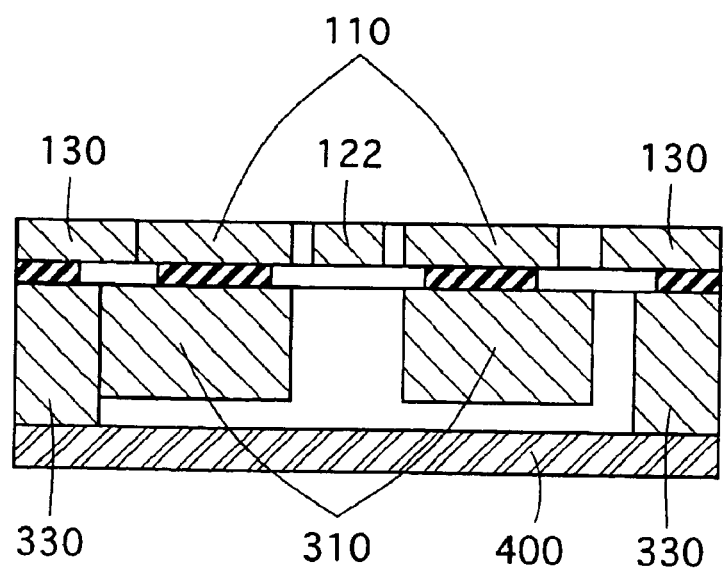
FIG. 12 is a sectional side view showing a condition where displacement control is made in the transducer structure shown in FIG. 9 when a force for displacing the weight 310 leftward is applied.

Displacements of the weight 310 in the horizontal direction of the figure are controlled by the pedestal 330. For example, when the weight 310 shown in FIG. 9 is forcibly displaced leftward in the figure, as shown in FIG. 12, the side surface of the weight 310 comes into contact with the inner surface of the pedestal 330 over the course of time, whereby the weight is prevented from displacing further.

The pedestal 330 is a structure surrounding all sides of the weight 310, so that all horizontal displacements of the weight 310 are controlled by the pedestal 330. Therefore, the predetermined distance d1 shown in FIG. 9 is a dimensional value that gives the weight 310 freedom in horizontal displacements, and the value is set within a safe range in which the substrate layer 100 is prevented from being broken upon consideration as to what degree of a horizontal displacement of the weight 310 causes the substrate layer 100 to break.

Figure 13:
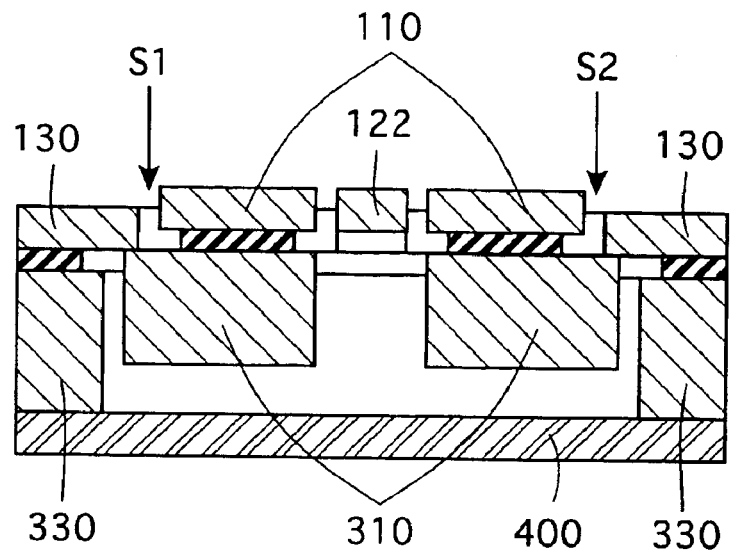
FIG. 13 is a sectional side view showing a condition where displacement control is made in the transducer structure shown in FIG. 9 when a force for displacing the weight 310 upward is applied.

Furthermore, displacements of the weight 310 in the upward direction in the figure are controlled by the control surface at the lower surface of the inner side of the fixed section 130. For example, when the weight 310 shown in FIG. 9 is forcibly displaced upward in the figure, as shown in FIG. 13, the upper surface peripheral portion comes into contact with the lower surface (control surface) of the inside of the fixed section 130, whereby the weight is prevented from displacing further.

Figure 11:
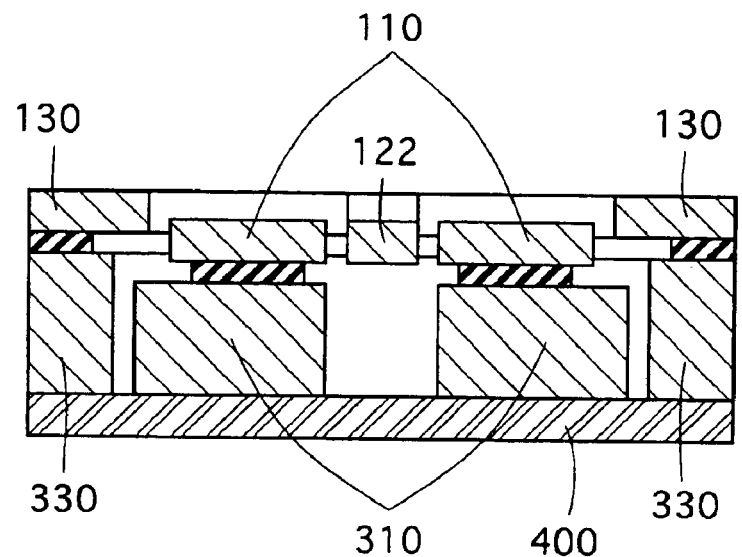
FIG. 11 is a sectional side view showing a condition where displacement control is made in the transducer structure shown in FIG. 9 when a force for displacing a weight 310 downward is applied.
Figure 14:
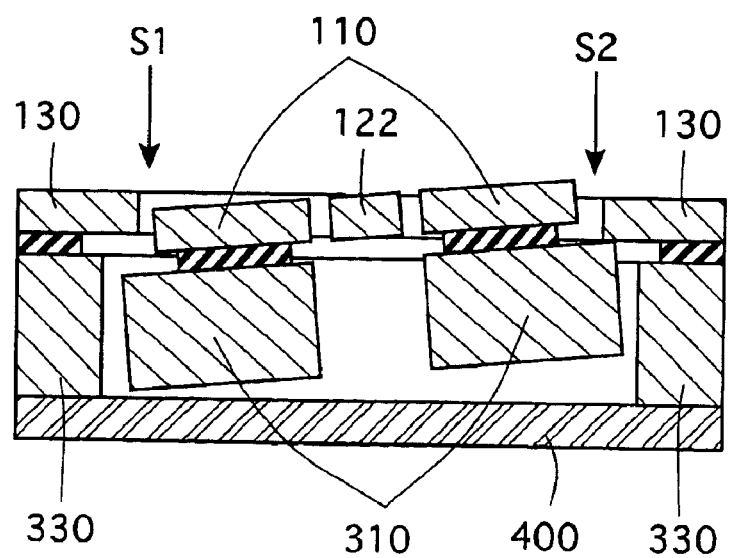
FIG. 14 is a sectional side view showing a condition where displacement control is made in the transducer structure shown in FIG. 9 when a force for rotating the weight 310 is applied.

Such displacement control is effective not only in the case where a force to displace the weight 310 vertically upward is applied but also in a case where rotation moment is applied to the weight 310. Namely, as shown in FIG. 14, even when a force to incline the weight 310 is applied, any portion of the upper surface periphery of the weight 310 comes into contact with the control surface of the lower surface of the inner side of the fixed section 130, whereby the weight is controlled so as not to further displace. In the example shown in FIG. 14, a portion of the weight 310 on the upper right side of the figure is in contact with the lower surface of the fixed section 130, and if stronger rotation moment is further applied, a portion of the weight 310 on the lower left side of the figure comes into contact with the upper surface of the control substrate 400, whereby displacement control by the control substrate 400 is also simultaneously made. In an actual acceleration sensor, an acceleration in the upward direction of the figure is applied to the weight 310, displacement control as shown in FIG. 13 is made, and when a downward acceleration is applied, displacement control as shown in FIG. 11 is made. However, when a horizontal acceleration is applied, not the displacement control of FIG. 12, but the displacement control of FIG. 14 is made. The reason for this is that the horizontal acceleration acts on the weight 310 as rotation moment since only the upper portion of the weight 310 is supported via the connecting section 120.

When comparing the displacing section 110 having a fan shape shown in the top view of FIG. 5 with the weight 310 having a fan shape shown in the horizontal sectional view of FIG. 8, although both are structures having fan shapes in plan views, it is found that the contour of the latter one slightly expands more than the contour of the former. Namely, the contour of the weight 310 shown in FIG. 8 is obtained by expanding the contour of the displacing section 110 of FIG. 5 outward. This characteristic is clearly shown in the sectional side view of FIG. 2. In FIG. 2, the left end of the weight blade portion 311 shown as a component of the lower layer 300 deviates leftward from the left end of the blade portion 111 shown as a component of the upper layer 100. Due to this positional relationship, the upper surface peripheral portion A12 of the weight 310 (the left end of the upper surface of the weight blade portion 311 in FIG. 2) is positioned immediately under the control surface A11 formed at the lower surface of the fixed section 130 so as to face the control surface. Likewise, the right end of the weight blade portion 312 shown as a component of the lower layer 300 deviates rightward from the right end of the blade portion 112 shown as a component of the upper layer 100. Due to this positional relationship, the upper surface peripheral portion A22 of the weight 310 (the right end of the upper surface of the weight blade portion 312 in FIG. 2) is positioned immediately under the control surface A21 formed at the lower surface of the fixed section 130 so as to face the control surface.

This means that when the weight 310 displaces upward in the figure, the upper surface peripheral portion A12 or A22 comes into contact with the control surface A11 or A21 to prevent further displacements, and this is an essential characteristic of the acceleration sensor of the invention. Only the control surfaces A11 and A21 at both left and right ends are shown in the sectional side view of FIG. 2, however, in actuality, this control is made in the control regions A10, A20, A30, and A40 that are shown by hatching in the top view of FIG. 15. Namely, in FIG. 15, portions at the lower surface side of the fixed section 130 corresponding to the control regions A10, A20, A30, and A40 are referred to as the control surfaces A11, A21, A31, and A41, and portions at the upper surface side of the weight 310 corresponding to the control regions A10, A20, A30, and A40 are referred to as the upper surface peripheral portions A12, A22, A32, and A42, respectively. The control surfaces A11, A21, A31, and A41 are surfaces formed at the lower surface of the inner side of the fixed section 130 (in other words, surfaces formed in the regions outside and close to the slits S1 through S4 of the lower surface of the substrate layer 100), and the upper surface peripheral portions A12, A22, A32, and A42 are surfaces formed at the peripheral portion of the upper surface of the weight 310. Furthermore, since the upper surface peripheral portions A12, A22, A32, and A42 are disposed at the positions opposite to the control surfaces A11, A21, A31, and A41, upward displacements of the upper peripheral portions A12, A22, A32, and A42 are controlled as mentioned above.

Thus, in the embodiment described herein, the contour of the upper surface of the weight 310 having a fan shape is formed by expanding the contour of the displacing section 110 having a fan shape outward, whereby displacement control by the control surfaces becomes possible at every portion of the upper peripheral portion of the weight 310.

Of course, a control structure for controlling upward, horizontal, and downward displacements of the weight is provided in the conventional acceleration sensors disclosed in the abovementioned publications. However, as aforementioned, in mass production of the acceleration sensors with accurate control structures suitable for the shape and position of the weights, a great technical burden is imposed on the manufacturing process in the conventional cases. The acceleration sensor having the structure of the invention reduces this technical burden on the manufacturing process. Hereinafter, the reason for this reduction is described.

It has been described above that, in the transducer structure shown in the side sectional view of FIG. 2, upward displacements of the weight 310 are controlled by contact between the control surfaces A11 and A21 and the upper peripheral portions A12 and A22. Herein, it is important that the distance between the control surfaces A11 and A21 and the upper surface peripheral portions A12 and A22 is accurately set by the thickness of the middle layer 200 (the thickness of the weight joint layer 210 and the thickness of the pedestal joint layer 230). In other words, the degree of freedom of upward displacements of the weight 310 is determined by the thickness of the middle layer 200. The middle layer 200 is formed from a material different from that of the upper layer (substrate layer) and the lower layer 300, so that the middle layer serves as a spacer interposed between the substrate layer 100 and the weight 310. By employing the trilaminar structure including this middle layer 200 interposed to serve as a spacer, it becomes possible to set the degree of freedom of upward displacements of the weight 310 to a fixed value (thickness of the middle layer 200). Therefore, even in mass production by means of a comparatively simple manufacturing process, the degree of freedom of weight displacements is prevented from significantly changing among lots.

Figure 15:
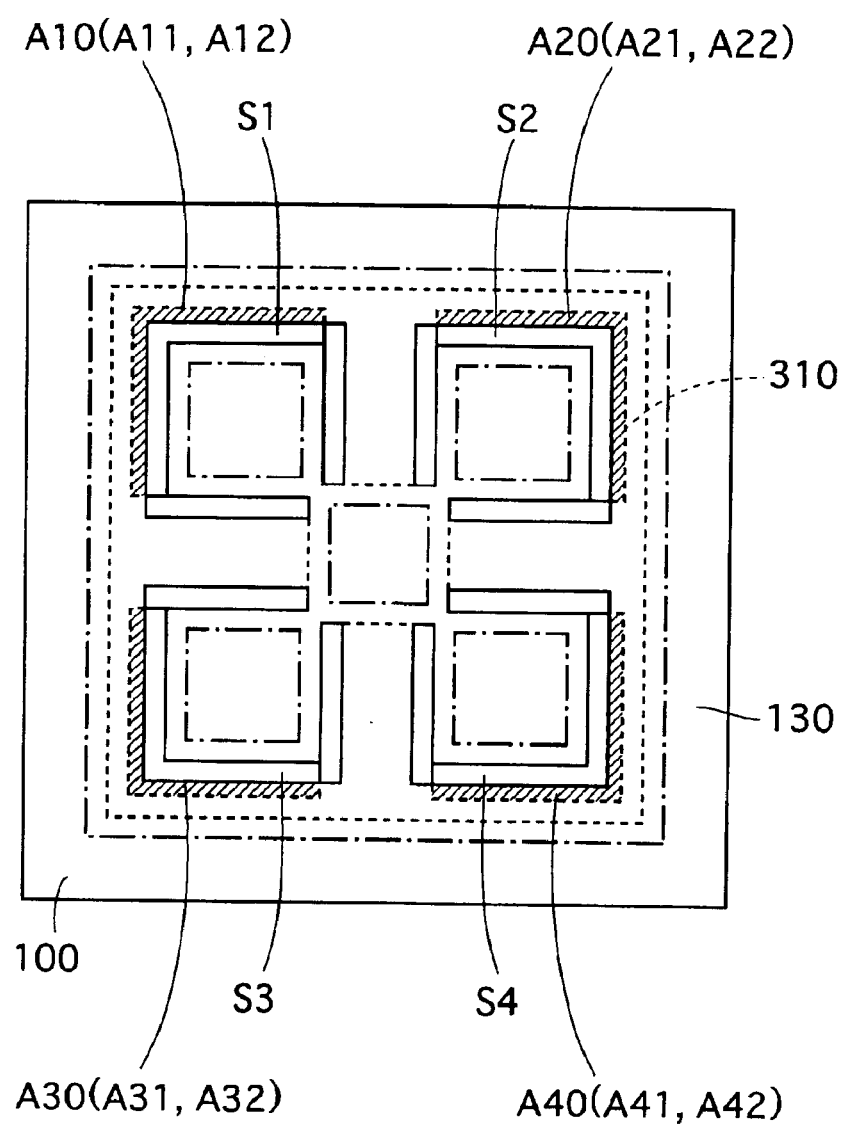
FIG. 15 is a top view showing the positional relationship between a control surface provided at a fixed section 130 and an upper peripheral portion of the weight 310 in the transducer structure of FIG. 1.

In order to make it possible for the weight 310 to displace upward within a predetermined range of freedom, it is necessary to interpose the weight joint layer 210 into a range other than the upper surface peripheral portions (region other than the control regions A10, A20, A30, and A40 shown by hatching in FIG. 15) in the space between the weight 310 and the substrate layer 100. In the example shown in FIG. 15, the weight joint layer 210 (blade portion joint layers 211 through 214 and the central portion joint layer 215: see FIG. 7) is interposed at the position shown by an alternate long and short dashed line. The thickness of this weight joint layer 210 is set to an appropriate value so that upward displacements of the weight 310 are controlled within the predetermined range and the substrate layer 100 is prevented from being broken even when an applied acceleration exceeds the predetermined tolerance.

As mentioned above, the invention is characterized in that the structure for controlling upward displacements is accurately positioned by interposing a weight joint layer 210 that serves as a spacer between the substrate layer 100 and the weight 310.

<<Section 3. Detailed Examples of Displacement Detector>>

As mentioned above, the invention is characterized by the unique construction of the transducer structure, and any type of displacement detector can be used as long as the acceleration sensor uses the transducer structure of the invention. However, for reference, two preferable detailed examples of displacement detector to be applied to the transducer structure mentioned above are shown hereinafter.

Figure 16:
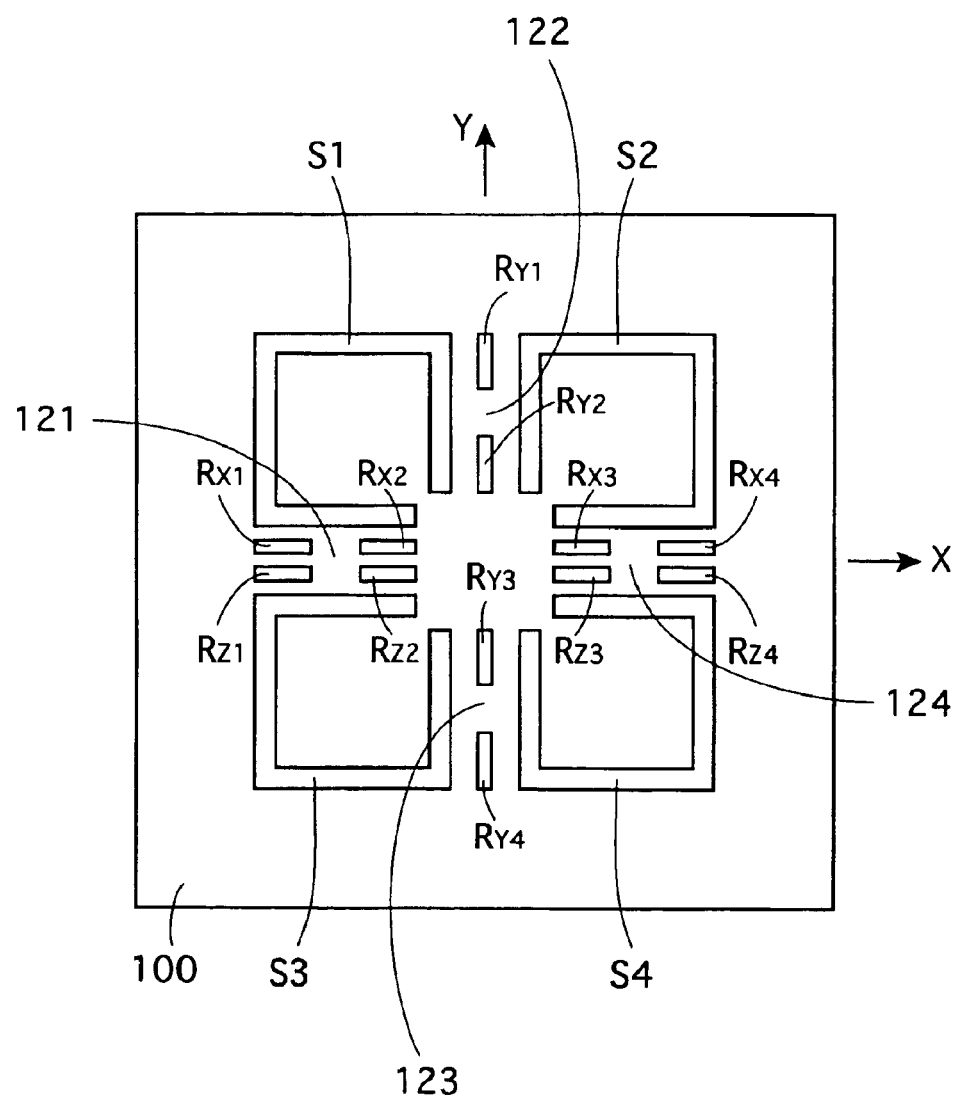
FIG. 16 is a top view showing an example in which a displacement detector using piezo resistor elements is applied to the transducer structure of FIG. 9.

In the first example, the displacement detector comprises piezo resistor elements disposed on the connecting portions and detecting circuits for detecting changes in electric resistance of the piezo resistor elements. For example, as shown in the top view of FIG. 16, twelve piezo resistor elements Rx1 through Rx4, Ry1 through Ry4, and Rz1 through Rz4 are formed on the connecting portions 121, 122, 123, and 124. Herein, the substrate layer 100 is formed as an n-type silicon layer, and a p-type impurity is dispersed herein, whereby the respective piezo resistor elements can be formed (the relationship between the n-type and p-type may be inverted). The piezo resistor element has characteristics to change its electric resistance when a stress is applied. In a case where the displacing section 110 displaces, the connecting portions 121, 122, 123 and 124 bend due to the stress. Therefore, by detecting the electric resistance value of each of the piezo resistor elements, stresses applied to the connecting portions 121, 122, 123, and 124 can be recognized, the displacing status of the displacing section 110, and the direction and degree of the acceleration applied to the weight can be determined.

From a practical standpoint, as in the above-mentioned embodiment shown in the figure, connecting portions 121 and 124 are formed at both left and right sides of the displacing section 110, and two piezo resistor elements Rx1 and Rx2 are disposed at the left side connecting portion 121, and two piezo resistor elements Rx3 and Rx4 are disposed at the right side connecting portion 124 so that a total of four piezo resistor elements Rx1 through Rx4 are roughly lined up. Thereby, a bridge circuit using these four piezo resistor elements Rx1 through Rx4 can detect an acceleration component concerning the aligning direction of the piezo resistor elements Rx1 through Rx4 or an acceleration component concerning the direction perpendicular to the substrate layer 100. For example, it is assumed that an origin O is set at the center of the substrate layer 100, and as illustrated, the rightward direction of the figure is defined as an X axis, the upward direction of the figure is defined as a Y axis, and the vertically upward direction from the page surface of the figure is defined as a Z axis. Thereby, a bridge circuit using the four piezo resistor elements Rx1 through Rx4 aligned along the X axis can detect an X axial component of an acceleration acting on the weight, and a bridge circuit using four piezo resistor elements Ry1 through Ry4 aligned along the Y axis can detect a Y axial component of the acceleration acting on the weight, and a bridge circuit using four piezo resistor elements Rz1 through Rz4 aligned along the X axis can detect a Z axial component of the acceleration acting on the weight.

Figure 17:
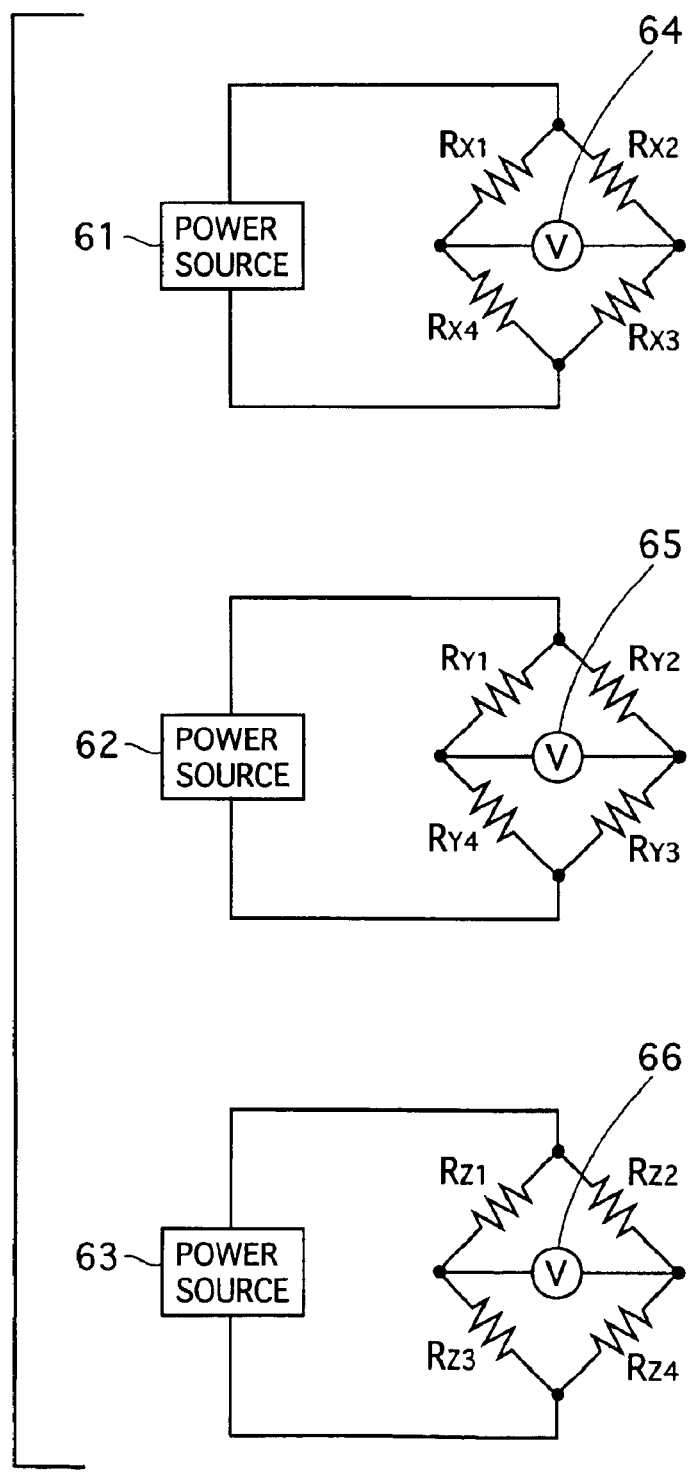
FIG. 17 is a circuit diagram showing an example of acceleration detecting circuits using the piezo resistor elements of FIG. 16.
Figure 18:
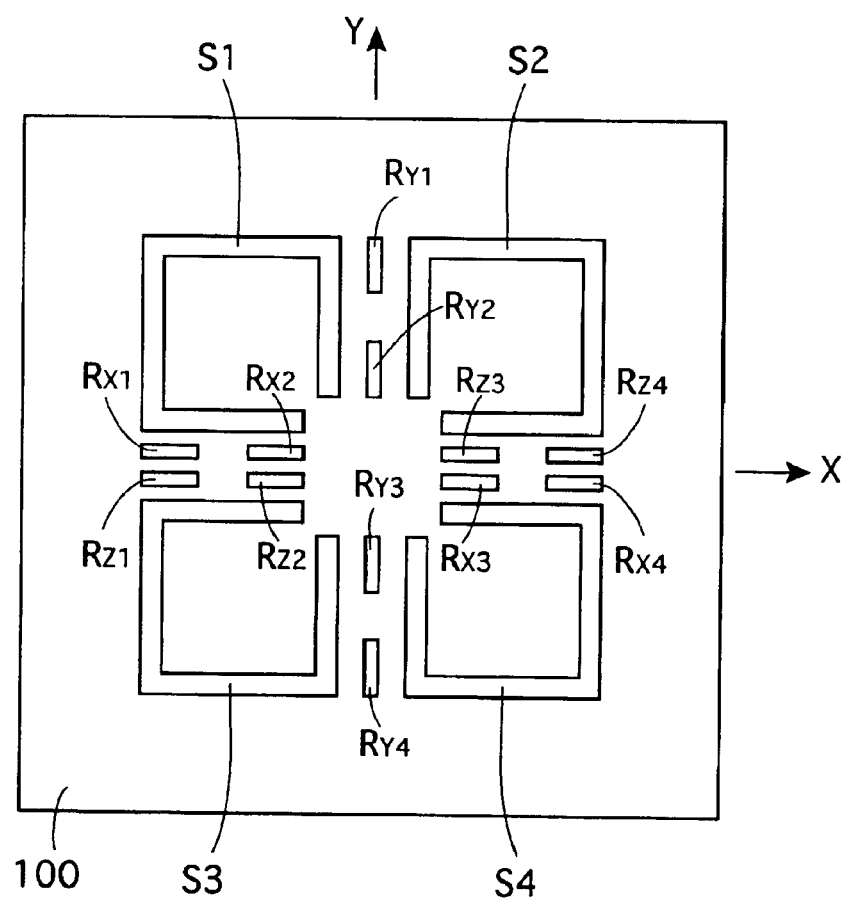
FIG. 18 is a top view showing another example in which a displacement detector using piezo resistor elements is applied to the transducer structure of FIG. 9.

FIG. 17 is circuit diagram showing detecting circuits for detecting these bridges. When predetermined voltages are applied to the respective bridges from power sources 61, 62, and 63 and the respective bridge voltages are detected with voltmeters 64, 65, and 66, voltages detected by these voltmeters 64, 65, and 66 indicate the X, Y, and Z axial components of an acceleration, respectively. According to an experiment conducted by the inventor of this application, the detection values became higher in accuracy in the layout of piezo resistor elements shown in FIG. 18 (the positions of the resistor elements Rx3 and Rx4 and the positions of the resistor elements Rz3 and Rz4 are replaced with each other) than in the layout of FIG. 16.

Next, the second example is illustrated. In this second example, the displacement detector comprises an auxiliary substrate disposed at a predetermined distance above the substrate layer, displacing electrodes formed on the upper surface of the displacing section, fixed electrodes formed on the lower surface of the auxiliary substrate, and detecting circuits that are comprised of the displacing electrodes and fixed electrodes for detecting changes in capacitance of capacitor elements.

Figure 19:
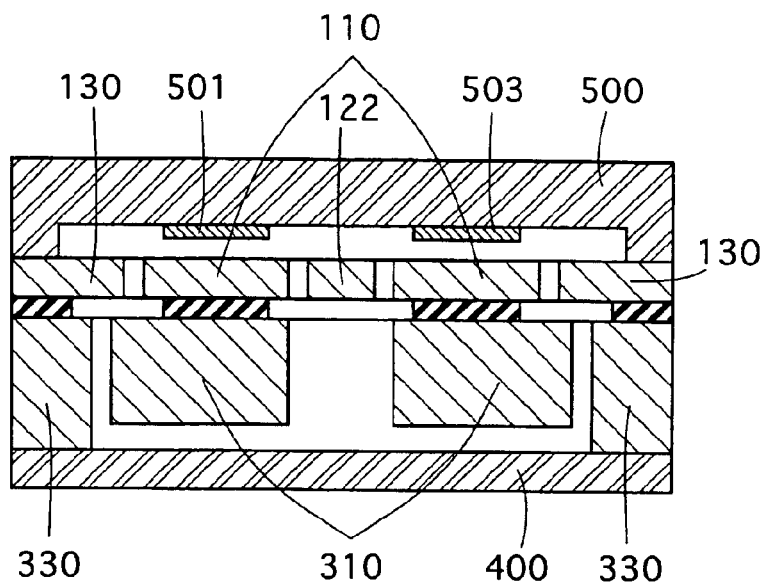
FIG. 19 is a sectional side view showing an example in which a displacement detector using capacitor elements is applied to the transducer structure of FIG. 9.
Figure 20:
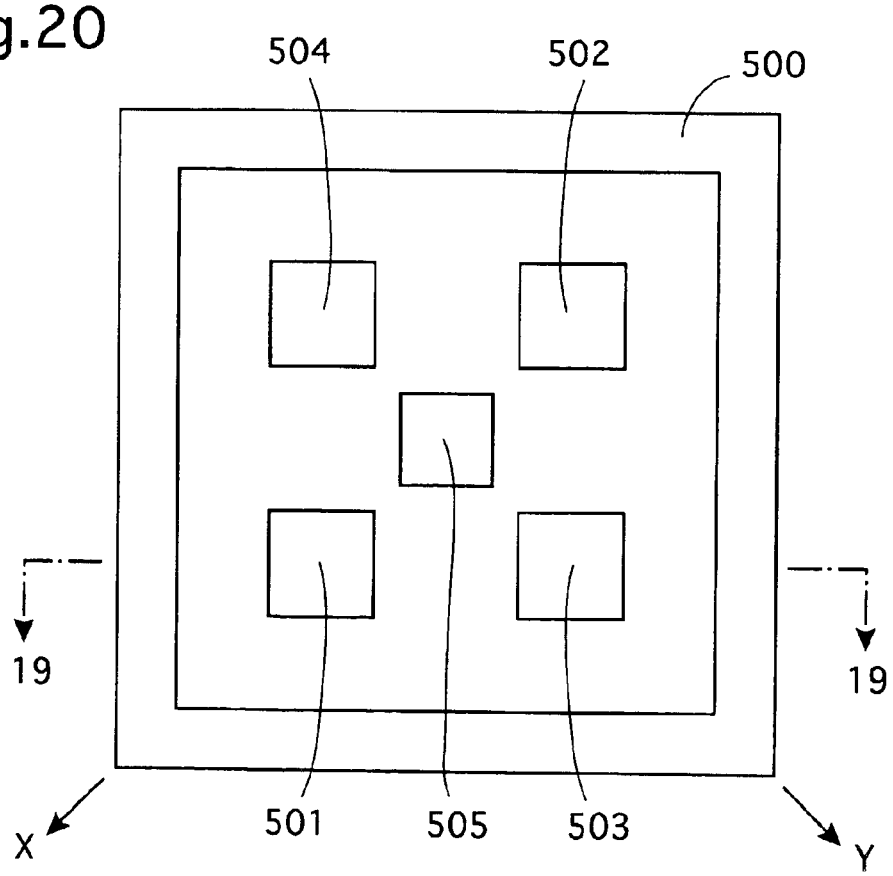
FIG. 20 is a bottom view of an auxiliary substrate 500 shown in FIG. 19.

For example, in the example shown in the sectional side view of FIG. 19, an auxiliary substrate 500 is attached above the substrate layer 100 in the transducer structure shown in FIG. 9. The lower surface of the auxiliary substrate 500 is disposed at a predetermined distance from the upper surface of the substrate layer 100. Furthermore, as shown in the bottom view of FIG. 20, five fixed electrodes 501, 502, 503, 504, and 505 are formed on the lower surface of this auxiliary substrate 500. The section of the auxiliary substrate 500 shown in the sectional side view of FIG. 19 is along the cutting line 19—19 of the auxiliary substrate 500 of FIG. 20. On the other hand, displacing electrodes are provided on the upper surface of the displacing section 110 so as to oppose these five fixed electrodes 501 through 505, and the fixed electrodes 501 through 505 and the displacing electrodes opposing these fixed electrodes form a total of five capacitor elements C1 through C5. Of course, from a practical standpoint, at least regions of the upper surface of the displacing section 110 opposing the respective fixed electrodes 501 through 505 are formed as conductive regions, this displacing section 110 itself can be used as the displacing electrodes. In the embodiment shown herein, the entire substrate layer 100 is formed of a conductive material (a silicon layer containing a high-density impurity dispersed) so that the entirety serves as one common electrode.

With this construction, the displacing status of the displacing section 110 can be recognized based on changes in capacitance of the five capacitor elements C1 through C5, and the direction and degree of an acceleration applied to the weight can be determined. Namely, the distance between the blade portions 111 through 114 and the central portion 115 that form the displacing section 110 and the auxiliary substrate 500 can be recognized based on the capacitance values of the capacitor elements C1 through C5, so that the degrees of respective directional components of the acceleration acting on the weight can be determined by means of operation based on these capacitance values.

Figure 21:
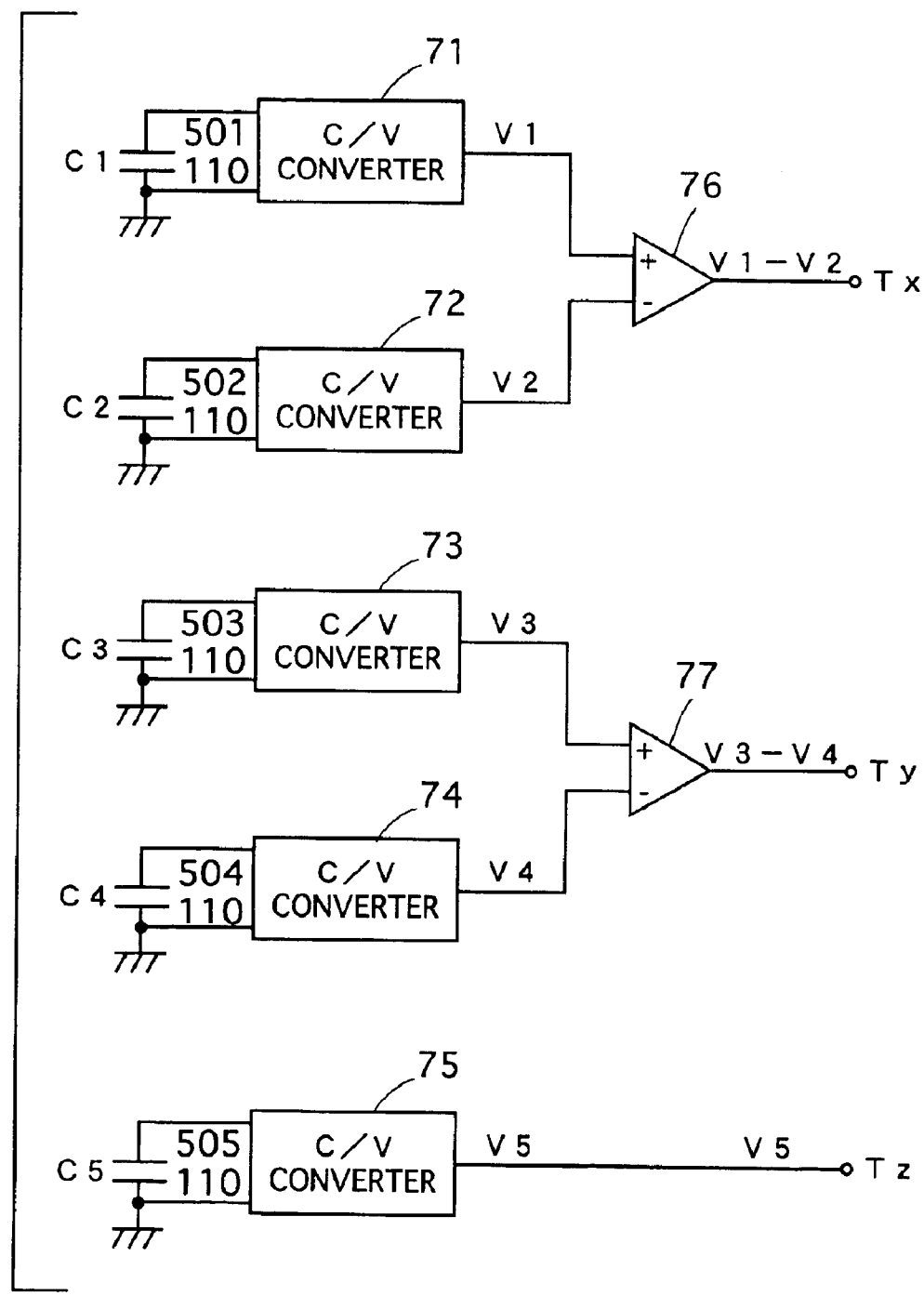
FIG. 21 is a circuit diagram showing an example of acceleration detecting circuits using the capacitor elements shown in FIG. 19.

FIG. 21 is a circuit diagram showing an example of detecting circuits which determine the respective directional components of an acceleration based on the principle mentioned above. The capacitor elements C1 through C5 in this circuit are constructed so that the conductive displacing section 110 is used as a common grounding electrode for one-side ends of the capacitor elements, and five fixed electrodes 501 through 505 are used as electrodes for other-side ends of the capacitor elements. The capacitance values of these capacitor elements are converted into voltage values V1 through V5 by C/V converters 71 through 75. Furthermore, a difference V1−V2 and a difference V3−V4 are determined by subtracters 76 and 77. The difference V1−V2 thus obtained at the output terminal Tx indicates an acceleration component in the X axial direction of FIG. 20, the difference V3−V4 obtained at the output terminal Ty indicates an acceleration component in the Y axial direction of FIG. 20, and the voltage V5 obtained at the output terminal Tz indicates an acceleration component in the Z axial direction that is vertically upward from the page surface of FIG. 20.

<<Section 4. Manufacturing Method for Acceleration Sensor>>

Next, an embodiment of a manufacturing method for the transducer structure described above is described with reference to the sectional side views of FIG. 22 and FIG. 23. The transducer structure shown in FIG. 9 is manufactured by the method described below. The sectional side views of FIG. 22 and FIG. 23 are equivalent to sectional views along the cutting line 2—2 of the transducer structure of FIG. 1.

Figure 22A:
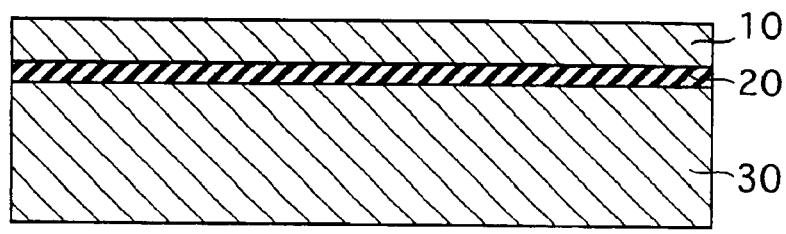
FIG. 22 are sectional side views showing the first half process of a manufacturing method for a transducer structure for an acceleration sensor relating to an embodiment of the invention.

First, as shown in FIG. 22A, a material substrate formed by laminating a first layer 10, a second layer 20, and a third layer 30 in order from the top is prepared. Herein, the first layer 10 is a layer for composing the upper layer 100 (substrate layer), and in this embodiment, this is formed of a silicon layer. The second layer 20 is a layer for composing the middle layer 200 (joint layer), and in this embodiment, this is formed of a silicon oxide layer. The third layer 30 is a layer for composing the lower layer 300 (including the weight and pedestal), and in this embodiment, this is formed of a silicon layer. Thus, the material substrate having the trilaminar structure of silicon/silicon oxide/silicon is commercially available as an SOI substrate, and this commercially available SOI substrate is prepared from a practical standpoint.

To carry out the manufacturing method described herein, it is required that the first layer 10 and the second layer 20 are formed from materials with different etching properties, and it is also required that the second layer 20 and the third layer 30 are formed from materials with different etching properties. The reason for this is that the second layer 20 must be used as an etching stopper layer when etching is applied to the first layer 10 from the upper side, and the second layer 20 must be used as an etching stopper layer when etching is applied to the third layer 30 from the lower side. As a result, in the finally obtained transducer structure, a material for forming the substrate layer 100, the pedestal 330, and the weight 310 and a material for forming the weight joint layer 210 and the pedestal joint layer 230 are different in etching property from each other. In the embodiment shown herein, the first layer 10 and the third layer 30 are formed from the same material (silicon), however, as a matter of course, the first layer 10, the second layer 20, and the third layer 30 can be formed from different materials.

Figure 22B:
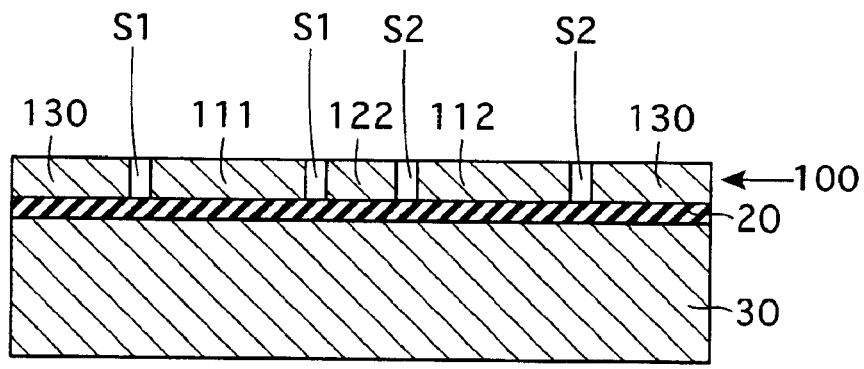

Next, by an etching method which has erodibility for the first layer 10 and has no erodibility for the second layer 20, predetermined regions of the first layer 10 are etched in the thickness direction until the upper surface of the second layer 20 is exposed to form slits in the first layer 10, whereby this first layer 10 is formed as a substrate layer 100 including a displacing section, a fixed section, and a connecting section. Slits formed herein are the slits S1 through S4 shown in FIG. 6. Therefore, in this etching step, a resist layer with a pattern corresponding to the hatching of FIG. 6 is formed on the upper surface of the first layer 10, and exposed portions that are not covered by this resist layer are eroded vertically downward. In this etching step, the second layer 20 is not eroded, so that only the predetermined regions of the first layer 10 are removed. FIG. 22B shows the condition where the first layer 10 has been thus changed into the substrate layer 100. In this figure, the blade portions 111 and 112 that are parts of the displacing section 110, the connecting portion 122 that is a part of the connecting section 120, and the fixed section 130 are shown. These parts are obtained by forming the slits S1 through S4 by means of etching (only S1 and S2 are shown in the figure).

Figure 22C:
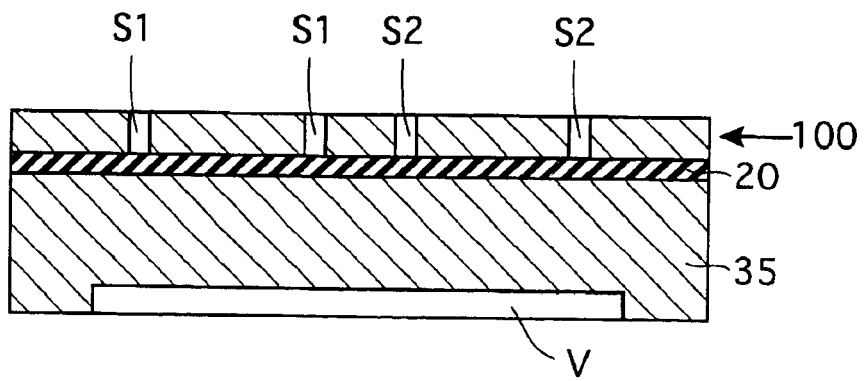

Next, the lower layer portion of the region to be formed as the weight in the third layer 30 is removed by etching so that the thickness of the weight portion becomes smaller than that of the pedestal portion. In this etching step, a resist layer with a pattern corresponding to the region of the pedestal 330 of FIG. 8 is formed on the lower surface of the third layer 30, and exposed portions that are not covered by this resist layer are eroded vertically upward. FIG. 22C shows the condition where the third layer 30 has changed into the third layer 35 by this step. At the bottom of the third layer 35, since the lower layer portion is removed by etching, a void portion V is formed. The height of this void portion V regulates the dimension d3 in FIG. 9, and determines the degree of freedom of downward displacements of the weight 310. The height of the void portion V can be controlled to a desired set value by adjusting the etching period.

Figure 23A:
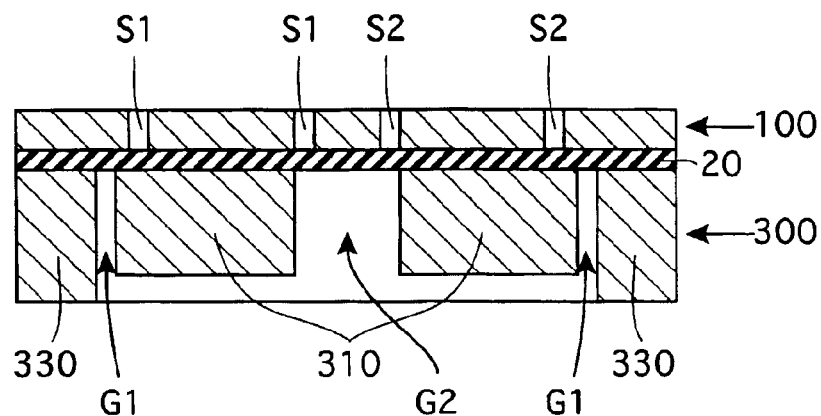
FIG. 23 are sectional side views showing the latter half process of the manufacturing method for a transducer structure for an acceleration sensor relating to an embodiment of the invention.

Then, by an etching method which has erodibility for the third layer 35 and has no erodibility for the second layer 20, predetermined regions of the third layer 35 are etched in the thickness direction until the lower surface of the second layer 20 is exposed to separate the third layer 35 into the weight 310 and the pedestal 330. In this etching step, a resist layer with a pattern corresponding to the hatching of FIG. 8 is formed on the lower surface of the third layer 35, and exposed portions that are not covered by this resist layer, that is, portions equivalent to the grooves G1 and G2 are eroded vertically upward. In this etching step, erosion is not applied to the second layer 20, so that only the predetermined regions of the third layer 35 are removed. FIG. 23A shows the condition where the third layer 35 has been thus changed into the lower layer 300 that is formed of the weight 310 and the pedestal 330. The grooves G1 and G2 are formed, and at these portions, the lower surface of the second layer 20 is exposed. Herein, it is important that the groove G1 is formed more outwardly than the positions of the slits S1 and S2 formed in the substrate layer 100. This is in order to make the contour of the structure having a fan shape that forms the weight 310 in the lower layer 300 larger than that of the structure having a fan shape that forms the displacing section 110 in the substrate layer 100. Thereby, as described above, the structure in which the upper surface outer peripheral portions of the weight 310 oppose the control surfaces formed on the lower surface of the fixed section 130 is obtained, and upward displacements of the weight 310 are controlled.

Figure 23B:
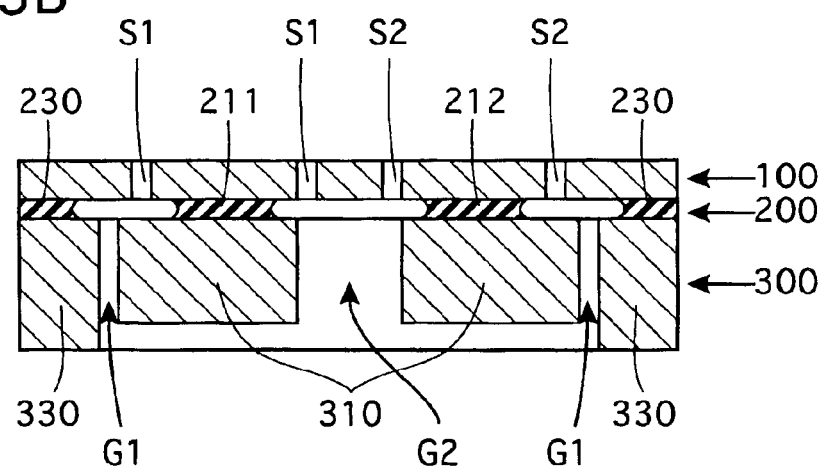

Next, by an etching method that has erodibility for the second layer 20 and has no erodibility for the first layer 10 and the third layer 30, the second layer 20 is etched in the thickness direction and the layer surface direction from the exposed portions, and the remaining portions compose the weight joint layer 210 and the pedestal joint layer 230. In this etching step, it is not necessary to separately form a resist layer. Namely, as shown in FIG. 23A, the upper layer (substrate layer) 100 that is a remainder of the first layer 10 and the lower layer 300 that is a remainder of the third layer 30 serve as a resist layer for the second layer 20, and etching is applied to the exposed portions of the second layer 20, that is, regions for forming slits S1 through S4 and the grooves G1 and G2. Furthermore, herein, an etching method in which the second layer 20 is eroded not only in the thickness direction but also in the layer surface direction is used. As a result, as shown in FIG. 23B, portions around the vicinities of the slits S1 through S4 and the vicinities of the regions for forming the grooves G1 and G2 in the second layer 20 are removed by etching, whereby the weight joint layer 210 (only the blade portion joint layers 211 and 212 are shown in the figure) and the pedestal joint layer 230 are formed.

Figure 23C:
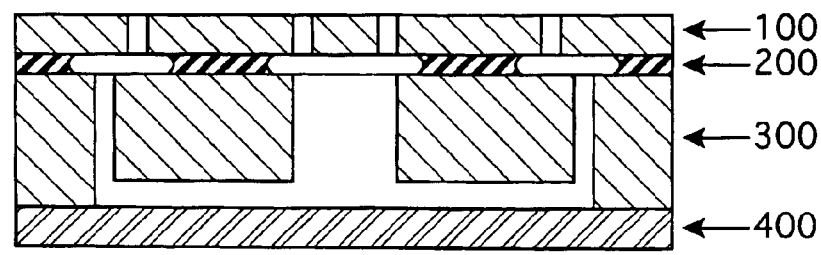

Last, the control substrate 400 (glass substrate in this embodiment) is joined to the bottom surface of the pedestal 330, whereby the structure of FIG. 23C is obtained. This is nothing less than the transducer structure shown in FIG. 9. In the structure of FIG. 23C, since the weight joint layer 210 and the pedestal joint layer 230 are formed by etching, the end faces of the joint layers composing the middle layer 200 are rounded, however, this does not influence joining of the substrate layer 100 and the lower layer 300.

In the abovementioned manufacturing process, in the step for forming the substrate layer 100 by etching the first layer 10 vertically downward (FIG. 22B) and the step for forming the lower layer 300 by etching the third layer 35 vertically upward (FIG. 23A), it is required that the etching method satisfies the following two conditions. The first condition is that the etching method has erodibility with directivity in the thickness direction of each layer, and the second condition is that the etching method has no erodibility for a silicon oxide layer although it has erodibility for a silicon layer. The first condition is necessary to form slits and grooves with predetermined widths, and the second condition is necessary to use the second layer 20 made from silicon oxide as an etching stopper layer.

In order to satisfy the first condition, use of an induced coupling plasma etching method (ICP etching method) is preferable. This etching method is effective for forming deep grooves in the vertical direction, and is one of the etching methods called DRIE (Deep Reactive Ion Etching). This method is characterized in that an etching step in which etching is carried out while eroding a material layer in the thickness direction and a deposition step in which a polymer wall is formed on the side surface of an etched hole are alternately repeated. The side surface of an etched hole is protected by a polymer wall that is successively formed, so that it becomes possible to advance erosion in only the thickness direction. On the other hand, in order to satisfy the second condition, an etching material having etching selectivity between silicon oxide and silicon is used.

The inventor of this application carried out etching under the following conditions to satisfy these two conditions, and obtained successful results. That is, the above-mentioned induced coupling plasma etching method was used and alternately repeated the etching step and the deposition step under the following detailed conditions. First, a material to be etched was put in a low-pressure chamber, and in the etching step, 100 sccm of an $SF_6$ gas and 10 sccm of an $O_2$ gas were supplied into the chamber, and in the deposition step, 100 sccm of $C_4F_8$ gas was supplied into the chamber. Etching was carried out at an etching rate of 3 mm/min by repeating the etching step and the deposition step for 10 seconds each. This etching method can also be used in the step for forming the void portion V at the bottom of the third layer 30 (FIG. 22C). As a matter of course, the manufacturing method of the invention is not limited to a method using the abovementioned etching method.

On the other hand, in the etching step of the second layer 20 (FIG. 23B), it is required that an etching method satisfying the following two conditions is used. The first condition is that the etching method causes erosion with directivity in the layer surface direction as well as the thickness direction, and the second condition is that the etching method has no erodibility for a silicon layer although it has erodibility for a silicon oxide layer. The first condition is necessary to prevent the joint layer from remaining at unnecessary portions and disturbing freedom in displacements of the weight, and the second condition is necessary to prevent erosion from reaching the substrate layer 100 and the lower layer 300 which are made from silicon and have already been etched into predetermined forms.

The inventor of this application carried out etching under the following conditions in actuality to satisfy these two conditions, and obtained successful results. That is, a buffered fluoride solution (mixture of $HF:NH_4F=1:10$) was used as an etchant, and a material to be etched was immersed in this etchant, whereby etching was carried out. The same successful results were also obtained in dry-etching by an RIE method using a mixed gas of a $CF_4$ gas and an $O_2$ gas. As a matter of course, the manufacturing method of the invention is not limited to a method using the abovementioned etching method.

The abovementioned manufacturing method is advantageous in that the distance between the substrate layer 100 and the lower layer 300 does not change even if the conditions such as temperature, pressure, gas concentration, and period of etching slightly change. Namely, the distance between these is equivalent to the dimension d2 shown in FIG. 9, and determines the degree of freedom of upward displacements of the weight 310, and this distance is always regulated by the thickness of the middle layer 200, and is not influenced by the etching conditions. Therefore, in mass production of acceleration sensors by the manufacturing method of the invention, accurate setting of dimensions becomes possible without unevenness among lots.

<<Section 5. Several Modification Examples>>

Last, modification examples of the transducer structure of the invention are described. In the above-mentioned embodiment, the control surfaces A11, A21, A31, and A41 of the fixed section 130 and the upper surface peripheral portions A12, A22, A32, and A42 of the weight 310 are opposed to each other in the control regions A10, A20, A30, and A40 that are shown by hatching in FIG. 15, whereby displacement control is made. However, in a case of an extremely small transducer structure, the widths of the control regions A10, A20, A30, and A40 are extremely narrow, and therefore, if a dimensional error occurs between the positions of the slits S1 through S4 and the position of the weight 310, there is a possibility that these control regions are not correctly formed. For example, in a case where the positions of the slits S1 through S4 entirely deviate diagonally upward to the left side, the area of the illustrated control region A10 is reduced by the deviation of the slit S1, and on the other hand, the area of the illustrated control region A40 increases due to the deviation of the slit S4. Therefore, when the degree of deviation reaches a certain extent, the control region A10 completely disappears, and the displacement control function at the upper left portion of the figure is completely lost.

Particularly, in the manufacturing process of Section 4, the structure of each portion is formed by means of etching, so that the abovementioned deviation may occur unless the etching positions are satisfactorily accurate. In mass production of acceleration sensors, a lot the displacement control function of which is incomplete due to etching failures must be excluded as a defective. However, in the case of the transducer structure shown in FIG. 15, it is difficult to externally check whether or not the displacement control function is normal. Namely, as far as the top view of FIG. 15 shows, portions of the weight 310 are only exposed through the slits S1 through S4, and the existences of the illustrated control regions A10, A20, A30, and A40 are concealed under the fixed section 130 and cannot be visually confirmed.

Figure 24:
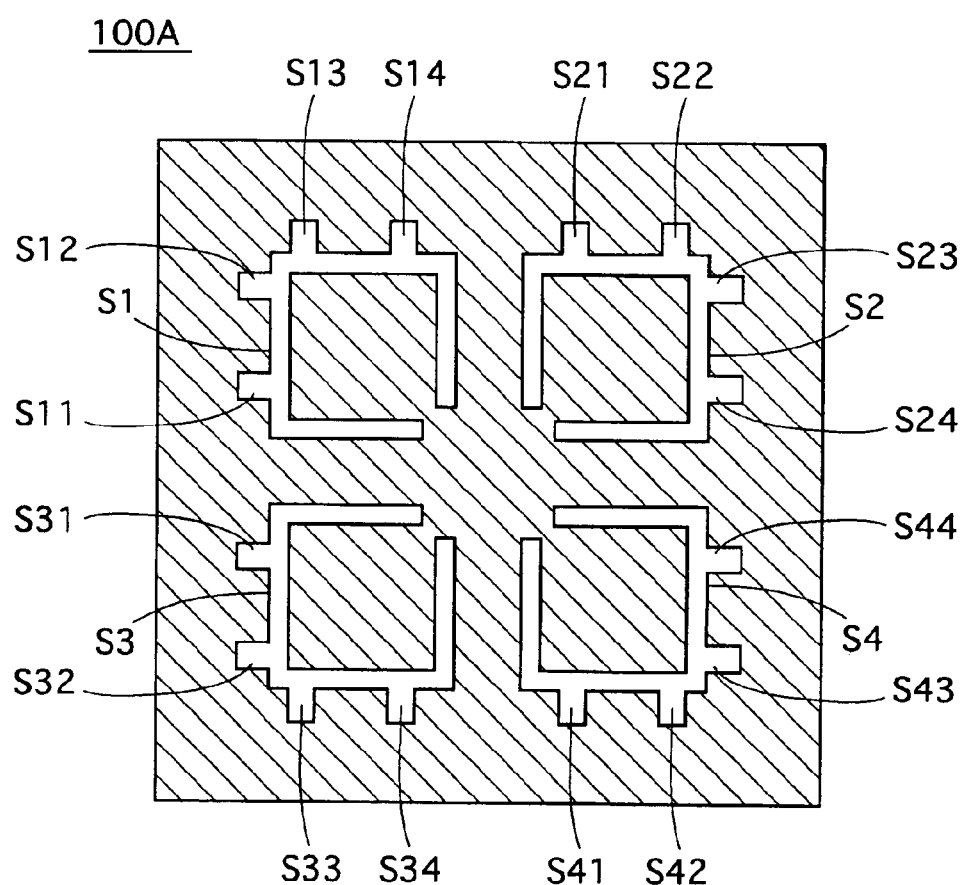
FIG. 24 is a horizontal sectional view of an upper layer 100A used in a first modification example of the invention.
Figure 25:
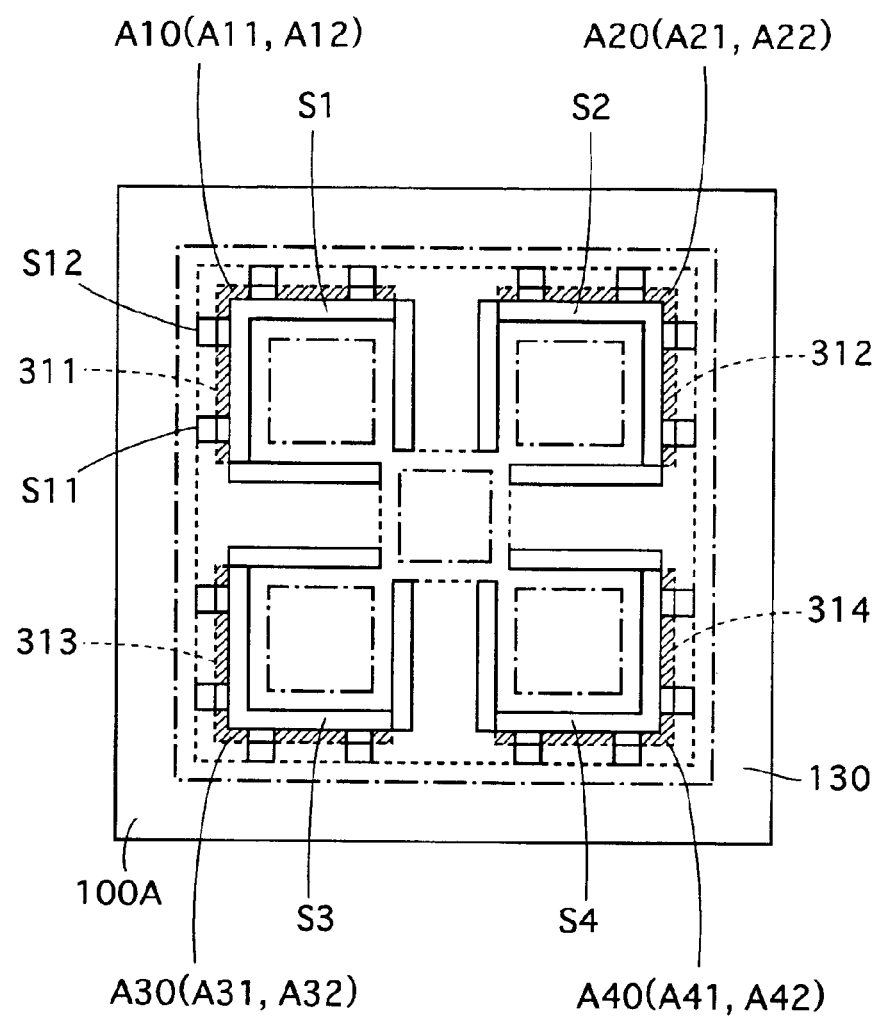
FIG. 25 is a top view of a transducer structure using the upper layer 100A shown in FIG. 24.

A first modification example to be described herein is for solving this problem. In this modification example, in place of the upper layer 100 shown in the horizontal sectional view of FIG. 6, the upper layer 10A shown in the horizontal sectional view of FIG. 24 is used. This upper layer 100A is characterized in that hoof-formed slits S11 through S14, S21 through S24, S31 through S34, and S41 through S44 are formed around the slits S1, S2, S3, and S4. These hoof-formed slits function as checking windows for a visual check of the contour position of the weight 310. FIG. 25 is a top view of the transducer structure using this upper layer 100A. As in FIG. 15, the control regions A10, A20, A30 and A40 shown by hatching are for performing the displacement control function. However, in comparison with the structure of FIG. 15, the hoof-formed slits are formed in the structure shown in FIG. 25, so that the contour position of the weight 310 can be visually checked through the hoof-formed slits. For example, the position of the left side contour portion of the weight blade portion 311 can be checked by viewing the insides of the illustrated hoof-formed slits S11 and S12.

Figure 26:
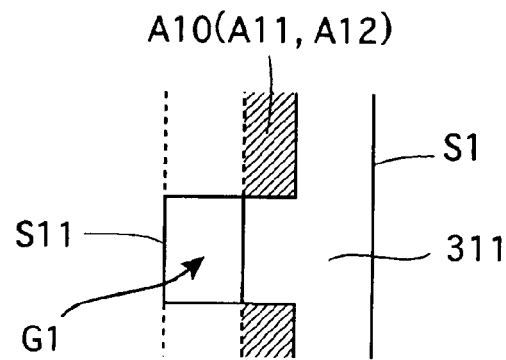
FIG. 26 is an enlarged top view around a hoof-formed slit S11 shown in FIG. 25.

FIG. 26 is an enlarged top view around the hoof-formed slit S11 of FIG. 25. As illustrated, by viewing the inside of the hoof-formed slit S11 from above, it can be confirmed that the weight blade portion 311 is positioned on the right and the groove G1 is positioned on the left. The boundary between these shows the left side contour position of the weight blade portion 311. Therefore, by viewing the inside of each hoof-formed slit dispersedly disposed at the upper layer 100A, the entire contour of the weight 310 can be recognized, and it can be judged whether or not the control regions A10, A20, A30, and A40 have been correctly formed. Of course, in a case of an extremely small transducer structure, the same judgement can be made by enlarging it with optical means such as a microscope. As shown in FIG. 25, by providing hoof-formed slits, the area of the control regions is slightly reduced, however, this hardly influences the displacement control function. Thus, the "upper surface peripheral portions" of the weight and the "control surfaces" formed at the lower surface of the inner side of the fixed section in the invention are not necessarily formed so as to completely surround the periphery of the weight, and are allowed to disperse at portions at which efficient control of displacements of the weight is possible.

A second modification example to be described next is an example of a further reduction in area of the control regions. In this embodiment, an upper layer 100B shown in FIG. 27 is used in place of the upper layer 100 shown in FIG. 6, a middle layer 200B shown in FIG. 28 is used in place of the middle layer 200 shown in FIG. 7, and a lower layer 300B shown in FIG. 29 is used in place of the lower layer 300 shown in FIG. 8 (all of these figures are horizontal sectional views cut along surfaces parallel to the layer surfaces).

Figure 27:
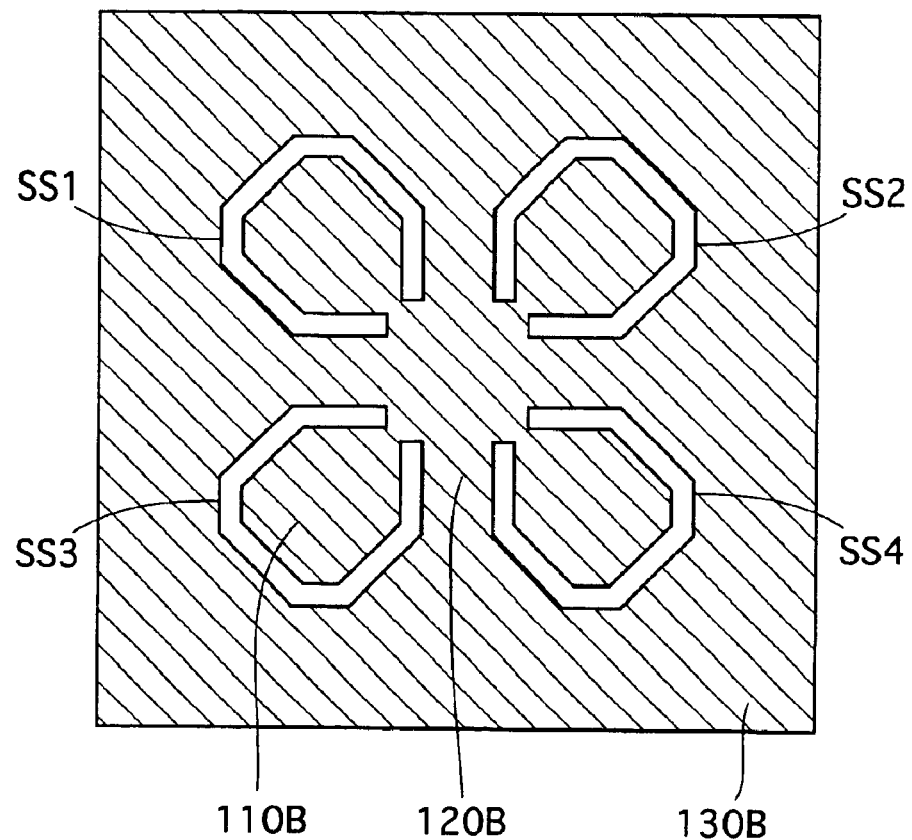
FIG. 27 is a horizontal sectional view of an upper layer 100B used in a second modification example of the invention.

First, when viewing the upper layer 100B shown in FIG. 27, it is confirmed that four slits SS1 through SS4 have been formed. These slits are not square but nearly octagonal. All of these slits are not perfectly annular octagonal, and have apertures at portions close to the center of the upper layer 100B. In other words, these slits SS1 through SS4 are shaped by chamfering the three corners of each of square-shaped slits S1 through S4 that are formed at the upper layer 100 of FIG. 6. In actuality, this chamfered corner serves as a control surface. On the other hand, the middle layer 200B shown in FIG. 28 is composed of a weight joint layer 210B disposed at five central positions (blade portion joint layers 211B through 214B and a central portion joint layer 215B) and a pedestal joint layer 230B surrounding the weight joint layer. The corners of the blade portion joint layers 211B through 214B are chamfered so as to be suitable for the shapes of the slits SS1 through SS4 (achieved by the etching step of Section 4). The lower layer 300B shown in FIG. 29 is composed of a weight 310B having a fan shape (including the weight blade portions 311B through 314B and weight central portion 315B) and a pedestal 330B surrounding this weight, and these are separated from each other by grooves GG1 and GG2.

Figure 28:
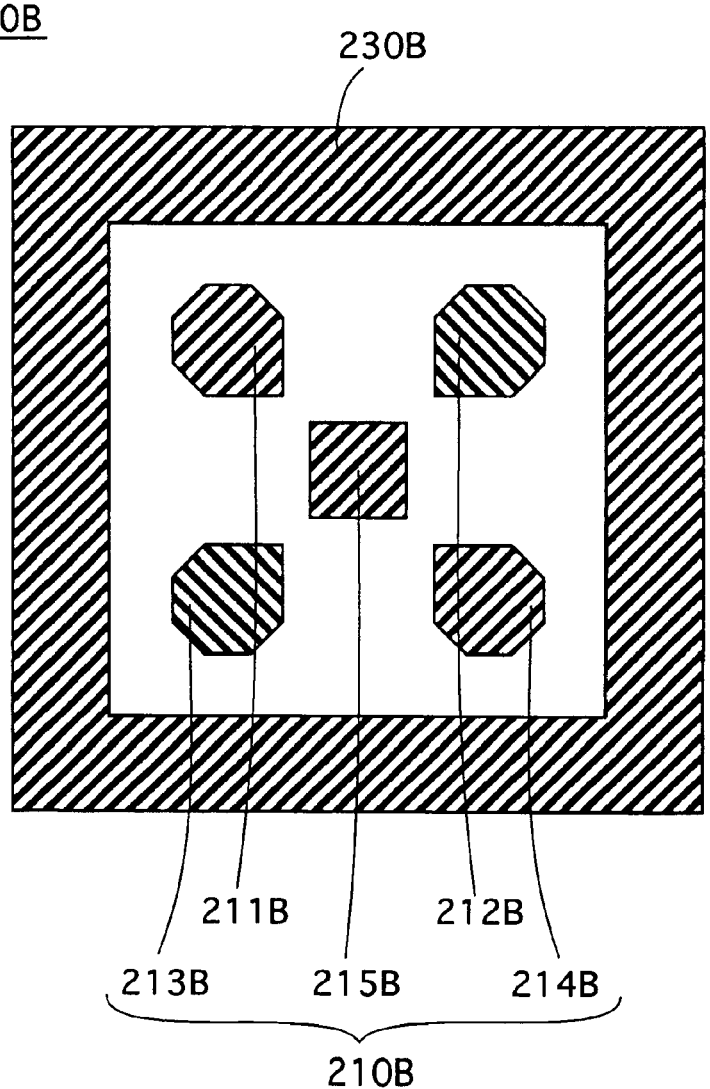
FIG. 28 is a horizontal sectional view of a middle layer 200B used in the second modification example of the invention.
Figure 29:
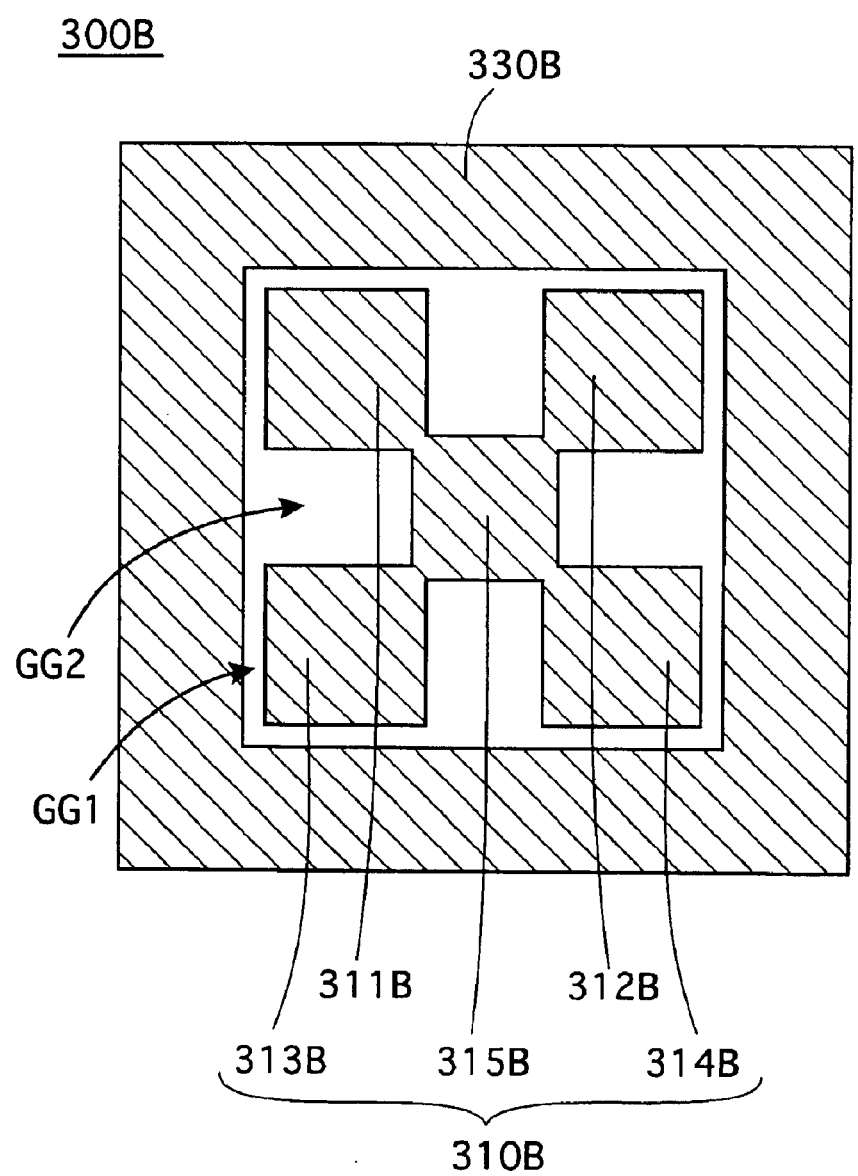
FIG. 29 is a horizontal sectional view of a lower layer 300B used in the second modification example of the invention.

Herein, in plan view comparison between the weight joint layer 210B and the weight 310B, although the weight blade portions 311B through 314B shown in FIG. 29 are square, the blade portion joint layers 211B through 214B shown in FIG. 28 are shaped by chamfering the three corners of each square. In reality, the three corners of each square of the weight blade portions 311B through 314B serve as upper peripheral portions, however, the blade portion joint layers 211B through 214B are shaped by omitting these regions of the upper surface peripheral portions, so that a predetermined distance d2 (thickness of the middle layer 200B is secured between the upper surface peripheral portions and control surfaces, and this makes it possible for the weight 310B to displace upward within the range of the degree of freedom corresponding to the distance d2.

Figure 30:
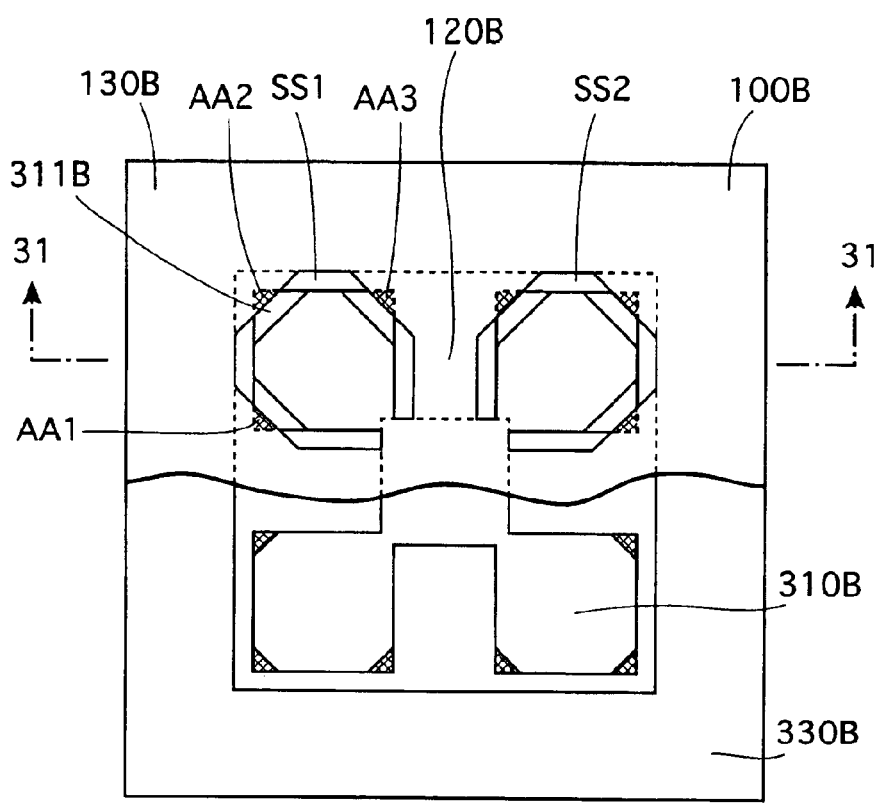
FIG. 30 is a top view of a transducer structure relating to the second modification example. In the upper half of this figure, the position of the lower layer 300B is shown by a dashed line and illustration of the middle layer 200B is omitted, and the lower half of this figure shows a condition where the upper layer 100B and the middle layer 200B are removed (that is, a top view of the lower layer 300B).

FIG. 30 is a top view of a transducer structure formed by laminating the upper layer 100B, the middle layer 200B, and the lower layer 300B (a part of the lower layer 300B is shown by a dashed line, and the middle layer 200B is omitted in the figure). The lower half of the figure shows a condition where the upper layer 100B and the middle layer 200B are removed (that is, the upper surface of the lower layer 300B). In this figure, the two-dimensional positional relationship between the slits SS1 through SS4 formed at the upper layer 100B and the weight 310 can be clearly recognized. The regions with hatching are the control regions, and the control regions at the lower surface of the upper layer 100B serve as "control surfaces", and the control regions at the upper surface of the weight 310B serve as "upper surface peripheral portions". For example, from the positional relationship between the slit SS1 and the weight blade portion 311B under the slit SS1, it can be understood that displacements of the square weight blade portion 311B are controlled by the control regions AA1, AA2, and AA3 at the three positions as illustrated. Displacements of the four weight blade portions 311B through 314B are controlled at three points, respectively. "The upper surface peripheral portions opposing the control surfaces" in the invention are not necessarily provided at the entire periphery of the upper surface of the weight 310, and it is sufficient that they are provided at a part of the periphery as the regions with hatching shown in FIG. 30. In a case where the connecting portion 120B is comparatively hard, it is possible to further reduce the number of control regions. For example, in the example shown in FIG. 30, three control regions AA1, AA2, and AA3 are provided at the periphery of the slit SS1, however, it is also possible to reduce these to only one control region AA2.

Figure 31:
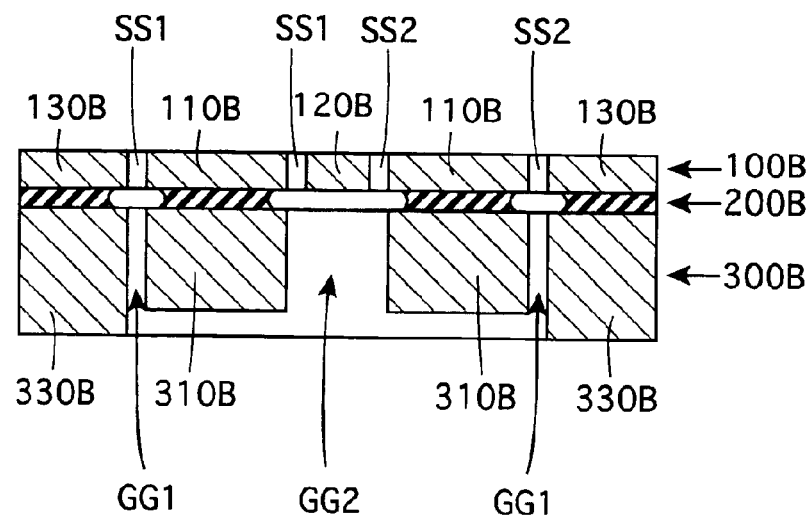
FIG. 31 is a sectional side view showing a condition where the transducer structure of FIG. 30 is cut along the cutting line 31—31 of the figure.

FIG. 31 is a sectional side view showing a condition where the transducer structure of FIG. 30 is cut along the cutting line 31—31 of FIG. 30. As illustrated, a groove GG1 of the lower layer 300B is formed immediately under the slits SS1 and SS2 of the upper layer 100B, and as far as this sectional side view shows, no structure for controlling displacements of the weight 310B by the lower surface of the fixed section 130B is shown. However, in the structure shown in FIG. 30, if you imagine a side cross sectional view cut along a diagonal cutting line with an angle of 45 degrees, it can be easily understood that there is a structure for controlling displacements of the upper surface peripheral portion of the weight 310B by a control surface on the lower surface of the fixed section 130B at a portion corresponding to the control region AA2.

As described above, the acceleration sensor and the manufacturing method for the same of the invention easily achieve an accurate control structure for limiting displacements of the weight.

What is claimed is:

1. An acceleration sensor comprising:
   a displacing section;
   a fixed section provided adjacent to said displacing section;
   a connecting portion for connecting said displacing section to said fixed section so that said displacing section can displace;
   a weight connected to said displacing section below;
   a pedestal which is disposed adjacent to said weight;
   a pedestal joint layer connecting said pedestal and said fixed section; and
   a displacement detector for detecting a displacement of said displacing section;
   wherein said weight includes an upper surface peripheral portion that opposes a control surface formed on a lower surface of said fixed section so that when an acceleration with a certain degree of magnitude is applied to said weight, said upper surface peripheral portion comes into contact with said control surface to control displacement, and
      wherein a weight joint layer made of the same material as that of the pedestal joint layer is provided between the weight and the displacing section, and said weight and said displacing section are joined together by said weight joint layer.

2. The acceleration sensor according to claim 1:
wherein the pedestal joint layer is made of a material different from that of the pedestal and the fixed section.

3. The acceleration sensor according to claim 2:
wherein a material for forming the pedestal joint layer and a material for forming the pedestal and the fixed section are different in etching property from each other.

4. The acceleration sensor according to claim 1:
wherein the fixed section is provided around the displacing section and the pedestal is disposed around the weight.

5. The acceleration sensor according to claim 1:
wherein a thickness of the pedestal joint layer is set to be equal to a distance between the upper surface peripheral portion and the control surface when no acceleration is applied.

6. The acceleration sensor according to claim 1:
wherein a distance between a side surface of the weight and a side surface of the pedestal is set so that displacement of the weight is controlled by contact of said side surface of the weight with said side surface of the pedestal when an acceleration with a certain degree of magnitude is applied.

7. The acceleration sensor according to claim 1:
wherein a thickness of the weight is set so that a bottom surface of the weight is located above a bottom surface of the pedestal with a predetermined distance, and when the pedestal is fixed on a control substrate, said predetermined distance is secured between the bottom surface of the weight and the upper surface of said control substrate, said predetermined distance being set so that displacement of the weight is controlled by contact of the bottom surface of the weight with the upper surface of the control substrate when an acceleration with a certain degree of magnitude is applied.

8. The acceleration sensor according to claim 1: the displacement detector includes piezo resistor elements disposed on the connecting portion and a detecting circuit for detecting electric resistance changes of said piezo resistor elements.

* * * * *